United States Patent
Kumagai (12)

(10) Patent No.: US 6,329,693 B1
(45) Date of Patent: Dec. 11, 2001

(54) SEMICONDUCTOR MEMORY DEVICE AND METHOD OF MANUFACTURING THE SAME

(75) Inventor: Takashi Kumagai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/591,088

(22) Filed: Jun. 9, 2000

(30) Foreign Application Priority Data

Jun. 9, 1999 (JP) .................................... 11-162115
Dec. 7, 1999 (JP) .................................... 11-347642

(51) Int. Cl.[7] .......................... H01L 29/76; H01L 29/94; H01L 31/062; H01L 31/113; H01L 31/119
(52) U.S. Cl. ......................... 257/371; 257/372; 257/373; 257/903
(58) Field of Search ................................. 257/371, 372, 257/373, 903, 904

(56) References Cited

U.S. PATENT DOCUMENTS 5,990,535 * 11/1999 Palara ................................... 257/500
6,025,621 * 2/2000 Lee et al. ............................. 257/296
6,144,076 * 11/2000 Puchner et al. ...................... 257/369

* cited by examiner

Primary Examiner—Ngân V. Ngô
(74) Attorney, Agent, or Firm—Hogan & Hartson, L.L.P.

(57) ABSTRACT

A semiconductor memory device has a silicon substrate 10. A first embedded layer 11 is formed in the silicon substrate 10 under a p-well 18 in an area below a region where a drain 36 of a driver transistor 30 is located. The first embedded layer 11 makes a junction with the p-well 18. Also, the first embedded layer 11 is formed below an n-well 16 and contacts the n-well 16. When the drain 36 of the driver transistor 30 is at a voltage of 3V, α-ray may pass through the p-well 18, the first embedded layer 11 and the silicon substrate 10. As a result, electron-hole pairs are cut. Due to the presence of the p-n junction that is formed by the p-well 18 and the first embedded layer 11, only electrons in the p-well 18 are drawn to the drain 36. As a result, a fall in the drain voltage of 3V is reduced. As a consequence, the device structure makes it difficult to destroy retained data.

9 Claims, 27 Drawing Sheets

SEMICONDUCTOR MEMORY DEVICE AND METHOD OF MANUFACTURING THE SAME

BACKGROUND OF THE INVENTION

1. Field of the Invention

The present invention relates to a semiconductor memory device and, more particularly, to an SRAM (Static Random Access Memory) and a method for manufacturing the same.

2. Description of the Related Art

FIG. 27 shows an equivalent circuit diagram of an SRAM memory cell. A load transistor $Q_5$ and a driver transistor $Q_3$ form an inverter. A load transistor $Q_6$ and a driver transistor $Q_4$ form an inverter. The inverters are electrically connected to each other to form a flip-flop.

A transfer transistor $Q_2$ connects an output cell node 1000 of the inverter that is formed by the load transistor $Q_6$ and the driver transistor $Q_4$ and a bit line (BL). A gate electrode of the transfer transistor $Q_2$ is electrically connected to a word line.

Source regions of the load transistors $Q_5$ and $Q_6$ electrically connect to a power supply line $V_{DD}$. Source regions of the driver transistors $Q_3$ and $Q_4$ electrically connect to a ground line $V_{SS}$.

A transfer transistor $Q_1$ connects an output cell node 1002 of the inverter that is formed by the load transistor $Q_5$ and the driver transistor $Q_3$ and a bit line (/BL). A gate electrode of the transfer transistor $Q_1$ is electrically connected to a word line.

The flip-flop retains a state in which the cell node 1000 is at a voltage of 3V, for example, and the cell node 1002 is at a voltage of 0V, for example, as "1", for example. Also, the flip-flop retains a state in which the cell node 1000 is at a voltage of 0V, for example, and the cell node 1002 is at a voltage of 3V, for example, as "0", for example.

An SRAM may suffer a problem of an α-ray soft error. Materials for wiring layers, molding resin, and the like contain a very small amount of radioactive substances. The radioactive substances generate α-rays. The α-ray soft error is a phenomenon in which retained data is destroyed due to the α-ray. The destruction of retained data by the α-ray soft error will be described below in detail, with reference to the accompanying figure.

FIG. 25 is a cross-sectional view of a silicon substrate 200 in which the load transistor $Q_6$ and the driver transistor $Q_4$ are formed. The silicon substrate 200 is of a p-type. An n-well 202 and a p-well 204 are formed adjacent to each other. A source 212 and a drain 214 of the driver transistor $Q_4$ are formed in the p-well 204. A p-type well contact region 216 is formed in the p-well 204. The well contact region 216 is isolated from the source 212 by a field oxide film 206. The well contact region 216 and the source 212 are electrically connected to the ground line $V_{SS}$.

A source 218 and a drain 220 of the load transistor $Q_6$ are formed in the n-well 202. An n-type well contact region 222 is formed in the n-well 202. The well contact region 222 is isolated from the source 218 by a field oxide film 210. The well contact region 222 and the source 218 are electrically connected to the power supply line $V_{DD}$. The drain 220 is isolated from the drain 214 by a filed oxide film 208.

Next, the destruction of retained data by the α-ray soft error will be described with reference to FIGS. 25 and 26. As shown in FIG. 25, when the cell node 1000 is at 3V, for example, the drain 214 is at 3V, and the p-well 204 is biased to the ground line $V_{SS}$. Therefore, because a diode formed by the drain 214 and the p-well 204 is inversely biased, a depletion layer is formed.

In this state, if an α-ray passes through the drain 214 and the p-well 204 and reaches the silicon substrate 200, the depletion layer of the diode is warped by the α-ray. As a result, electron-hole pairs are cut along the pass of the α-ray. As shown in FIG. 26, the holes flow into the well contact region 216 and into the ground line $V_{SS}$. The electrons flow into the drain 214 that is at a high voltage. The flows of the holes and the electrons lower the drain voltage. As a result, the retained data is destroyed. In other words, in this example, the state of the cell node 1000 changes from 3V to 0V, and therefore the state "1" changes to "0".

SUMMARY OF THE INVENTION

It is an object of the present invention to provide a semiconductor memory device with a structure that is difficult to cause harmful effects on the memory function and a method for manufacturing the same.

In accordance with one embodiment of the present invention, a semiconductor memory device has a semiconductor substrate defining a main surface, and a peripheral circuit region and an SRAM memory cell region in the main surface. The semiconductor memory device comprises a first well, a second well of a first conductivity type, a third well of a second conductivity type, a device element isolation structure, an embedded layer of the second conductivity type, a driver transistor, a load transistor, and an impurity region of the second conductivity type. The first well is formed in the peripheral circuit region, and the second well is formed in the memory cell region. The second well is shallower than the first well. The driver transistor is formed in the second well. The impurity region is formed in the second well. The impurity region is a drain of the driver transistor. The impurity region is an element that composes a cell node. The third well is formed in the memory cell region. The third well is shallower than the first well. The load transistor is formed in the third well. The device element isolation structure is formed in the memory cell region. The device element isolation structure isolates the driver transistor from the load transistor. The second well and the third well are formed to extend to a location under the device element isolation structure. The embedded layer is formed under the second well and under an area where at least the impurity region is located. The embedded layer forms a junction with the second well. The embedded layer is fixed at a potential that prevents carriers of the second conductivity type in the embedded layer from flowing into the second well.

The semiconductor memory device in accordance with the embodiment achieves the following advantages.

The miniaturization of a memory cell must address two conflicting issues. The length of the device element isolation structure (such as a semi-recessed LOCOS oxidation layer) of the memory cell area needs to be shortened in order to miniaturize the memory cell. On the other hand, to prevent the generation of a parasitic MOS leak current that causes latch-up, the spacing between one well and source/drain of another well formed adjacent to the one well needs to be longer than a certain distance. Accordingly, when the length of the device element isolation structure is shortened to miniaturize the memory cell, the spacing between one well and the source/drain of another well formed adjacent to the one well may become too short to an extent that a parasitic MOS leak current may be readily generated. However, in accordance with the embodiment of the present invention, the length of the device element isolation structure can be reduced for the miniaturization of the memory cell, while the distance between one well and the source/drain of another well formed next to the one well can be prevented from becoming too short.

In a semiconductor memory device in accordance with one embodiment of the present invention, the wells in the peripheral circuit region and the wells in the memory cell region may be different in depth. In other words, the second and third wells formed in the memory cell region are shallower than the first well formed in the peripheral circuit region. Accordingly, this structure can reduce an overlapped area between the second well and the third well beneath the device element isolation structure. The reason for this will be described below in conjunction with the discussion of the embodiments. Accordingly, in a semiconductor memory device in accordance with the present invention, the length of the device element isolation structure can be reduced, while the distance between one well and the source/drain of another well formed next to the one well can be prevented from becoming too short.

In accordance with another embodiment of the present invention, the semiconductor memory device of the present invention further includes an embedded layer. The embedded layer is formed in an area under the second well where at least the impurity region is located. The embedded layer forms a junction with the second well. The embedded layer is fixed at a potential that prevents carriers of the second conductivity type in the embedded layer from flowing into the second well.

In the semiconductor memory device in accordance with the present invention, the embedded layer can prevent the generation of an α-ray soft error that may occur in the impurity region of the driver transistor (an element that forms a cell node). For example, when the semiconductor substrate is of a p-type, the embedded layer is an n-type, the second well is of a p-type, and the impurity region is of an n-type, the following phenomenon occurs.

Let us consider a situation when the impurity region of the driver transistor (an element that forms a cell node) is, for example, at a voltage of 3V, and an α-ray passes through the impurity region of the driver transistor, the second well, the embedded layer, and the semiconductor substrate. As a result, the electron-hole pairs are cut. It is believed that only electrons in the second well are drawn to the impurity region (element that forms a cell node) because of the presence of the p-n junction between the second well and the embedded layer. Electrons in the embedded layer and in the semiconductor substrate do not flow into the second well, because the embedded layer is fixed at a positive potential (a potential that prevents the electrons from flowing into the second well).

In the manner described above, only the electrons in the second well are drawn to the impurity region (element that forms a cell node). Accordingly, the voltage at the impurity region (element that forms a cell node) is difficult to become unstable, and, therefore, this makes the retained data difficult to be destroyed.

When a first embedded layer is an n-type, the impurity concentration of the first embedded layer is preferably 5E12–5E13 $cm^{-2}$. This impurity concentration is the same as the impurity concentration of a low resistance layer of the n-type first well.

In the embodiments of the present invention, the cell node refers to a node at which a transfer transistor and an output of an inverter that is formed by a load transistor and a driver transistor are connected to each other.

In accordance with the present invention, examples of the device element isolation structure include a LOCOS oxide film, a semi-recessed LOCOS oxide film, or a shallow trench (the depth ranging between about 0.4 and 0.8 $\mu m$).

In accordance with the present invention, the "source/drain" refers to at least one of a source and a drain.

In a semiconductor memory device in accordance with another embodiment of the present invention, the following structure may be added. For example, the semiconductor memory device of the present invention includes another impurity region of the first conductivity type. The another impurity region is formed in the third well. The another impurity region is a drain of the load transistor. The another impurity region is an element that forms the cell node. The embedded layer is not formed in an area under the third well where the another impurity region is located. The semiconductor substrate is the first conductivity type.

As a result of the addition of the above-described structure, the generation of an α-ray soft error that may occur in the another impurity region of the load transistor (an element that forms a cell node) can be prevented. For example, when the semiconductor substrate is of a p-type, the embedded layer is n-type, the third well is of an n-type, and the another impurity region is of a p-type, the following phenomenon occurs.

Let us consider a situation where the another impurity region of the load transistor (an element that forms a cell node) is, for example, at a voltage of 0V, and an α-ray passes through the another impurity region of the load transistor, the third well, and the semiconductor substrate, with the result that the electron-hole pairs are cut. As a result, it is believed that only holes in the third well are drawn to the another impurity region (element that forms a cell node) because of the presence of the p-n junction between the third well and the semiconductor substrate.

In this manner, since the embedded layer is not formed in an area under the third well where the another impurity region is located, only the holes generated in the third well among the holes generated by the α-ray result in a soft error. Because the third well is relatively shallow, relatively few holes are generated therein. As a result, the voltage of the another impurity region is difficult to become unstable, and this makes the retained data difficult to be destroyed.

In the semiconductor memory device in accordance with the present invention, the following structure may be added. The semiconductor memory device of the present invention further includes a well contact region of the second conductivity type. The well contact region is formed in the third well, the well contact region is a contact region that fixes a well potential of the third well, and the embedded layer contacts the third well.

As a result of the addition of the above-described structure, the potential of the embedded layer can be fixed at a potential that can prevent the carriers of the second conductivity type in the embedded layer from flowing into the second well. For example, when a positive voltage is applied to the well contact region, electrons generated in the embedded layer in the example described above are drawn from the embedded layer through the third well to the well contact region.

In the semiconductor memory device in accordance with the present invention, the following structure may be added. For example, the semiconductor memory device in accordance with the present invention includes another embedded layer of the first conductivity type. The another embedded layer is formed under the second well, and the another embedded layer contacts the second well.

As a result of the addition of the structure described above, the generation of latch-up can be prevented. More specifically, the conductivity type of the another embedded layer is the same as the conductivity type of the second well, and, therefore, the resistance of the second well is lowered. This contributes to the prevention of the generation of latch-up. In one embodiment, when the another embedded layer is a p-type, the another embedded layer may have an impurity concentration of 5E12–5E13 $cm^{-2}$.

In the semiconductor memory device in accordance with the present invention, the first well, the second well, and the third well may be retrograded wells. The retrograded well is a well that is formed by a high-energy ion implantation without using a thermal diffusion.

Each of the first well, the second well, and the third well, that are retrograded wells, has a first concentration layer, a second concentration layer, and a third concentration layer in the order from a top layer. The first well further has a fourth concentration layer under the third concentration layer. The first concentration layer may be, for example, a channel dope layer that adjusts the threshold voltage (Vth) of the transistor. The second concentration layer may be, for example, a punch-through stopper layer that suppresses the short channel effect of the transistor. The third concentration layer may be, for example, a channel-cut layer that prevents the operation of a parasitic transistor. The fourth concentration layer may be, for example, a low resistance layer that lowers the well resistance. In one embodiment, in the second and third wells, the first concentration layer may be a channel dope layer, the second concentration layer may be a channel stopper layer, and the third concentration layer may be a channel cut layer, for example.

In the semiconductor memory device in accordance with the present invention, the length of the device element isolation region that isolates the wells in the memory cell region may fall within a range of about 0.2 $\mu$m–1.6 $\mu$m. The border between the second well and the third well needs to be located below the device element isolation structure. When the resist is patterned, a positional alignment error may occur. Accordingly, the device element isolation structure requires a certain minimum length. The minimum length of the structure may be about 0.2 $\mu$m. Also, when the device element isolation structure has a length longer than about 1.6 $\mu$m, the size of the memory cell becomes too large.

In the semiconductor memory device in accordance with the present invention, the second well and the third well may have a depth of about 0.5–1.2 $\mu$m. When the second and third wells are shallower than about 0.5 $\mu$m, the device element isolation structure becomes deeper than the wells. This presents a problem in designing as to how a well contact region for fixing the potential of the well is formed. When the second and third wells are deeper than about 1.2 $\mu$m, the overlapped area between the second well and the third well, beneath the device element isolation structure, becomes greater.

In the semiconductor memory device in accordance with the present invention, the semiconductor substrate may be of a p-type. As a result, the p-type wells in the memory cell region are connected to one another through the semiconductor substrate, and, therefore, the resistance of the wells is lowered. As a result, this suppresses an increase in the substrate potential of a region, where the n-channel transistor (having a relatively large substrate current compared to the p-channel transistor) is formed.

In accordance with another embodiment of the present invention, a method is provided for manufacturing a semiconductor memory device having a semiconductor substrate defining a main surface, and a peripheral circuit region and an SRAM memory cell region in the main surface. The method includes the following steps. (a) A device element isolation structure is formed in the main surface. (b) A first well is formed by ion-implanting an impurity in the peripheral circuit region. (c) An embedded layer of a second conductivity type is formed by ion-implanting an impurity in the memory cell region. (d) A third well of the second conductivity is formed by ion-implanting an impurity in the memory cell region, wherein the third well is shallower than the first well, formed to extend to a location under the device element isolation structure, and in contact with the embedded layer. (e) A second well of the first conductivity type is formed by ion-implanting an impurity in the memory cell region. The second well is in contact with the third well in an area lower than the device element isolation structure, and is formed over the embedded layer. Also, the second well forms a junction with the embedded layer. (f) A driver transistor is formed in the second well. Among the impurity regions of the driver transistor, an impurity region that forms an element composing a cell node is formed in a manner that the embedded layer is located under the impurity region. (g) A load transistor is formed in the third well.

In the above-described embodiment of the present invention, a method is provided for manufacturing a semiconductor memory device that can prevent the distance between one well and source/drain of another well adjacent to the one well from becoming too short without excessively elongating the device element isolation structure.

In accordance with the present invention, an embedded layer is further formed, as described below. The embedded layer is formed in an area under the second well, under a region where the impurity region of the driver transistor (element that forms a cell node) is located, and forms a junction with the second well. Also, the embedded layer contacts the third well.

In the method for manufacturing the semiconductor memory device in accordance with the present invention, in step (b) and step (c), a resist pattern having a thickness of about 3.0 $\mu$m–8.0 $\mu$m is used as a mask, and in step (d) and step (e), a resist pattern having a thickness of about 1.2 $\mu$m–2.5 $\mu$m is used as a mask.

If the thickness of the resist pattern is thinner than about 3.0 $\mu$m in steps (b) and (c), the impurity penetrates the resist pattern when the ion implantation is performed to form a retrograded well. If the thickness of the resist pattern is thicker than about 8.0 $\mu$m, control of the configuration of the end portion of the resist pattern is difficult. As a result, a problem arises in which the length of the device element isolation structure needs to be increased.

If the thickness of the resist pattern is smaller than about 1.2 $\mu$m in steps (d) and (e), the impurity penetrates the resist pattern when the ion implantation is conducted to form a retrograded well. If the thickness of the resist pattern is greater than about 2.5 $\mu$m, the control of the configuration of the end portion of the resist pattern is difficult. As a result, a problem arises in which the overlapped area between the second well and the third well below the device element isolation structure becomes greater.

Either a positive resist or a negative resist works as the resist pattern in steps (b) and (c). Also, a positive resist or a negative resist works as the resist pattern in steps (d) and (e). However, more preferably, a positive resist may be used. This is because the positive resist outperforms the negative resist in the control of the vertical configuration of the end portion of the resist pattern and the dimensional control of the resist pattern.

In the method for manufacturing the semiconductor memory device in accordance with the present invention, the step of implanting ions in step (b) includes the step of implanting ions in step (c).

In the method for manufacturing the semiconductor memory device in accordance with another embodiment of the present invention, the following features may be added where the first well is a twin-well having a well of a first conductivity type and a well of a second conductivity type. Step (b) includes implanting ions in a region where the well of the first conductivity type is formed and implanting ions in a region where the well of the second conductivity type is formed, and step (d) includes implanting ions three times in a region where the third well is formed and in a region where the well of the second conductivity type in the peripheral circuit region is formed. The step of implanting ions three times forms the third well having a third concentration layer, a second concentration layer and a first concentration layer, in the order from a bottom layer, in the memory cell region. Step (b) and the step of implanting ions three times form the well of the second conductivity type having a fourth concentration layer, a third concentration layer, a second concentration layer and a first concentration layer, in the order from a bottom layer, in the peripheral circuit region. Furthermore, step (e) includes implanting ions three times in a region where the second well is formed and a region where the well of the first conductivity type in the peripheral circuit region is formed. The step of implanting ions three times forms the second well having a third concentration layer, a second concentration layer and a first concentration layer, in the order from a bottom layer, in the memory cell region; and step (b) and the step of implanting ions three times form the well of the first conductivity type having a fourth concentration layer, a third concentration layer, a second concentration layer and a first concentration layer, in the order from a bottom layer, in the peripheral circuit region.

In the method for manufacturing the semiconductor memory device in accordance with the present invention, the following step (h) may be added. For example, step (h) includes forming another embedded layer of the first conductivity type under a region where the second well is formed.

According to this manufacturing method, the semiconductor memory device has another embedded layer of the first conductivity type, wherein the another embedded layer is formed under the second well, and the another embedded layer contacts the second well.

In the method for manufacturing the semiconductor memory device in accordance with the present invention, the step of implanting ions in step (b) includes implanting ions in step (h).

Other features and advantages of the invention will be apparent from the following detailed description, taken in conjunction with the accompanying drawings which illustrate, by way of example, various features of embodiments of the invention.

DESCRIPTION OF PREFERRED EMBODIMENTS

[First Embodiment]
[Description of the Structure of Device]

Figure 1:
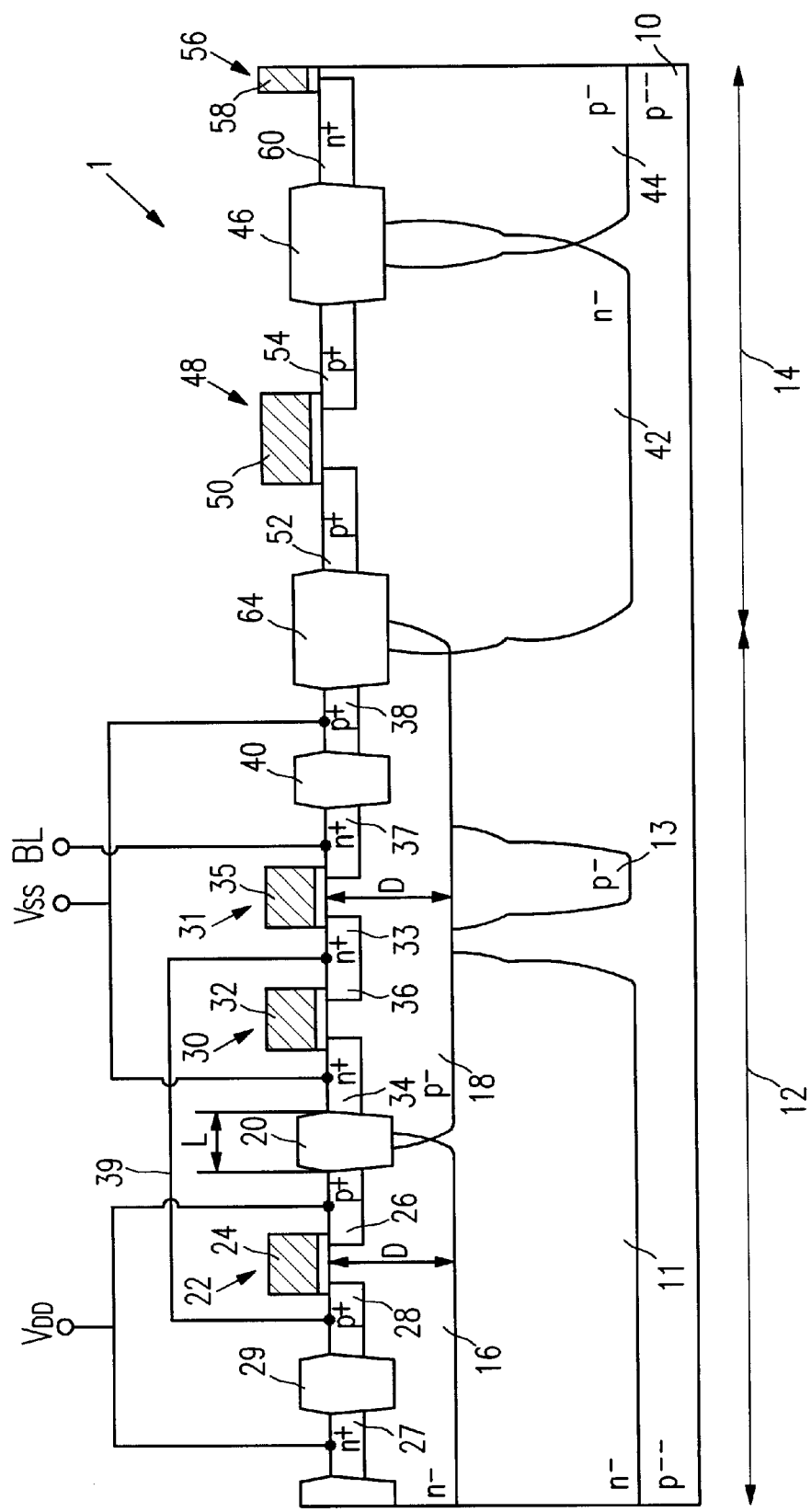
FIG. 1 is a cross-sectional view of a semiconductor memory device in accordance with a first embodiment of the present invention.

FIG. 1 is a cross-sectional view of a semiconductor memory device in accordance with a first embodiment of the present invention. The semiconductor memory device 1 is an SRAM. Referring to FIG. 1, the main surface of a p-type silicon substrate 10, as one example of semiconductor substrate, is divided into a memory cell region 12 and a peripheral circuit region 14.

An n-well 16 and a p-well 18 are formed in the memory cell area 12. The n-well 16 and the p-well 18 are retrograded wells. The n-well 16 and the p-well 18 overlap each other in a border between the n-well 16 and the p-well 18. A semi-recessed LOCOS oxidation layer 20 is formed on the border. The depth D of the n-well 16 and the depth D of the p-well 18 are about 0.5 $\mu$m–1.2 $\mu$m. The length L of the semi-recessed LOCOS oxidation layer 20 is about 0.2 $\mu$m–1.6 $\mu$m.

An n-type first embedded layer 11 and a p-type second embedded layer 13 are embedded in the silicon substrate 10 in the memory cell region 12. The location of the first embedded layer 11 will be described in detail. The first embedded layer 11 is formed below the p-type well 18 and in an area below a region where the driver transistor 30 is located and joined with the p-well 18. First embedded layer 11 is also formed under the n-well 16 and in contact with the n-well 16.

Next, the location of the second embedded layer 13 will be described in detail below. The second embedded layer 13 is formed in an area below a region where the transfer transistor 31 is located, and is in contact with the p-well 18.

A load transistor 22 is formed in the n-well 16. The load transistor 22 is a p-channel transistor. The load transistor 22 has a gate electrode 24, a p-type source 26 and a p-type drain 28. The source 26 connects to the power supply line $V_{DD}$. An n-type well contact region 27 is formed in the n-well 16. The well contact region 27 connects to a wiring that fixes the potential of the n-well 16. In this embodiment, the well contact region 27 connects to the power supply line $V_{DD}$. The well contact region 27 is isolated from the drain 28 by a semi-recessed LOCOS oxide film 29.

A driver transistor 30 is formed in the p-well 18. The driver transistor 30 is an n-channel transistor. The driver transistor 30 has a gate electrode 32, a n-type source 34 and an n-type drain 36. The source 34 connects to the ground line $V_{SS}$. The drain 36 connects to the drain 28 of the load transistor 22. A transfer transistor 31 is formed in the p-well 18. The transfer transistor 31 is an n-channel transistor. The transfer transistor 31 has a gate electrode 35, a source 33 and a drain 37. The source 33 and the drain 36 are formed from the same impurity region. The drain 37 connects to a bit line BL.

Also, a p-type well contact region 38 is formed in the p-well 18. The well contact region 38 connects to a wiring line that fixes the potential of the p-well 18. In the present embodiment, the well contact region 38 connects to the ground line $V_{SS}$. The well contact region 38 is isolated from the drain 37 by a semi-recessed LOCOS oxide film 40.

An inverter that is formed from the load transistor 22 and the driver transistor 30 is electrically connected to the transfer transistor 31 by a cell node 39. The drain 28, the drain 36 and the source 33 are parts of the cell note 39.

An n-well 42 and a p-well 44 adjacent thereto are formed in the peripheral circuit region 14. The n-well 42 and the p-well 44 are retrograded wells. The n-well 42 and the p-well 44 are overlapped each other in a border region between these wells. A semi-recessed LOCOS oxide film 46 is formed over the border.

A p-channel transistor 48 is formed in the n-well 42. The p-channel transistor 48 has a gate 50, and p-type source/drain 52 and 54. An n-channel transistor 56 is formed in the p-well 44. The n-channel transistor 56 has a gate electrode and two n-type source/drains. FIG. 1 shows a part of the gate electrode 58 and one source/drain 60. A semi-recessed LOCOS oxide film 64 is formed on the surface in a border region between the memory cell region 12 and the peripheral circuit region 14.

{Description of Method for Manufacturing Devices}

Figure 4:
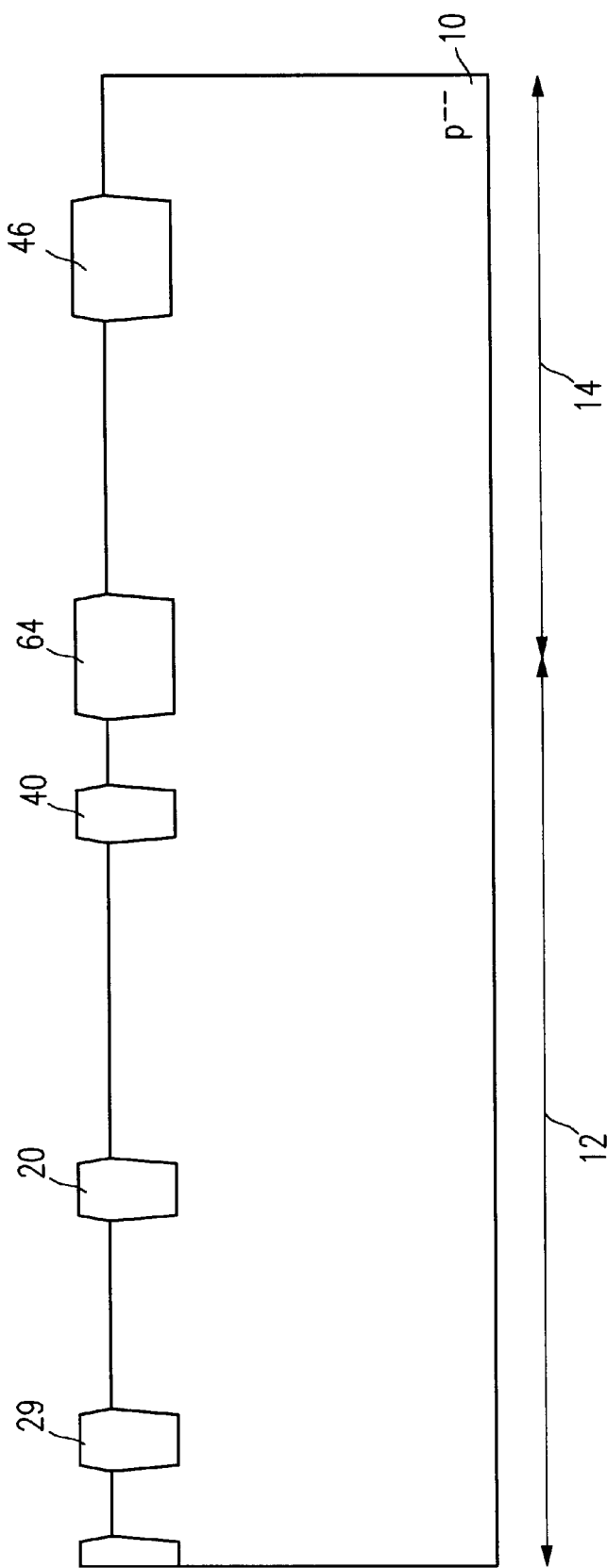
FIG. 4 is a cross-sectional view, which is used to describe a first step of a method for manufacturing the semiconductor memory device in accordance with the first embodiment of the present invention.

A method for manufacturing the semiconductor memory device 1 in accordance with one embodiment of the present invention will be described below with reference to FIGS. 4–11. A plurality of trenches (not shown) are formed in the main surface of the silicon substrate 10 that has an anti-oxidation layer, such as silicon nitride, formed thereon. As shown in FIG. 4, oxide films are formed in the trenches using the LOCOS technique. Semi-recessed LOCOS oxidation layers 29, 20, 40, 64 and 46, each having a thickness in a range of about 0.2–0.7 $\mu$m, are thus formed.

Figure 5:
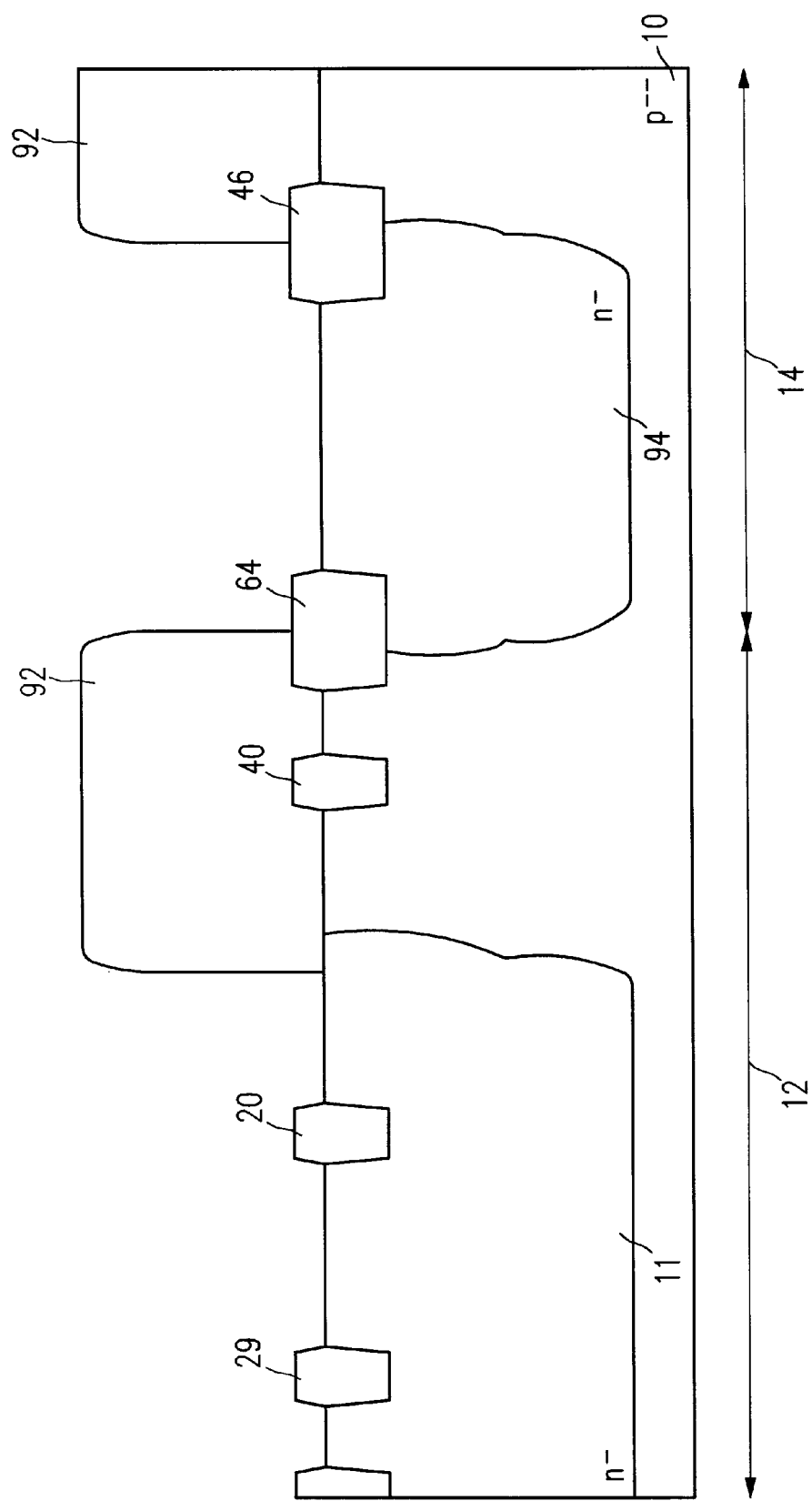
FIG. 5 is a cross-sectional view, which is used to describe a second step of a method for manufacturing the semiconductor memory device in accordance with the first embodiment of the present invention.

Referring to FIG. 5, a resist pattern 92 having a thickness in a range of about 3.0–8.0 $\mu$m is formed such that an n-well forming region in the peripheral circuit region 14 and a first embedded layer forming region in the memory cell region 12 are exposed. Phosphorous is implanted in the silicon substrate 10, using the resist pattern 92 as a mask, to form a low resistance layer 94 and a first embedded layer 11. The implantation energy ranges from 500 KeV to 3 MeV with a dose ranging from 5E12 to 5E13 cm$^{-2}$.

Figure 6:
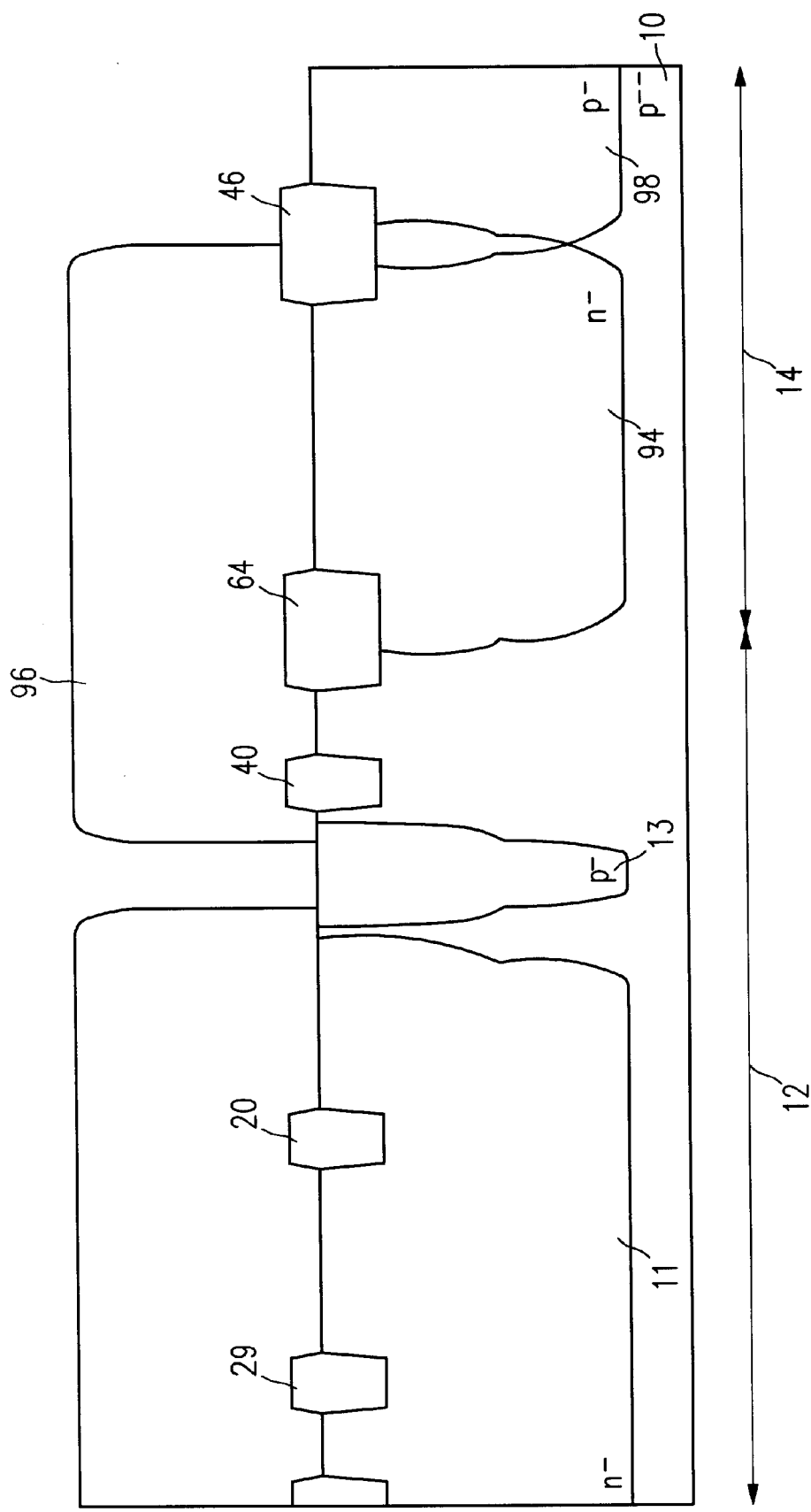
FIG. 6 is a cross-sectional view, which is used to describe a third step of a method for manufacturing the semiconductor memory device in accordance with the first embodiment of the present invention.

Referring to FIG. 6, a resist pattern 96 having a thickness in a range of 3.0 $\mu$m–8.0 $\mu$m is formed such that a p-well forming region and a second embedded layer forming region in the peripheral circuit region 14 are exposed. Boron is implanted in the silicon substrate 10, using the resist pattern 96 as a mask, to form a low resistance layer 98 and a second embedded layer 13. The implantation energy ranges from 300 KeV to 2 MeV with a dose ranging from 5E12 to 5E13 cm$^{-2}$.

Figure 7:
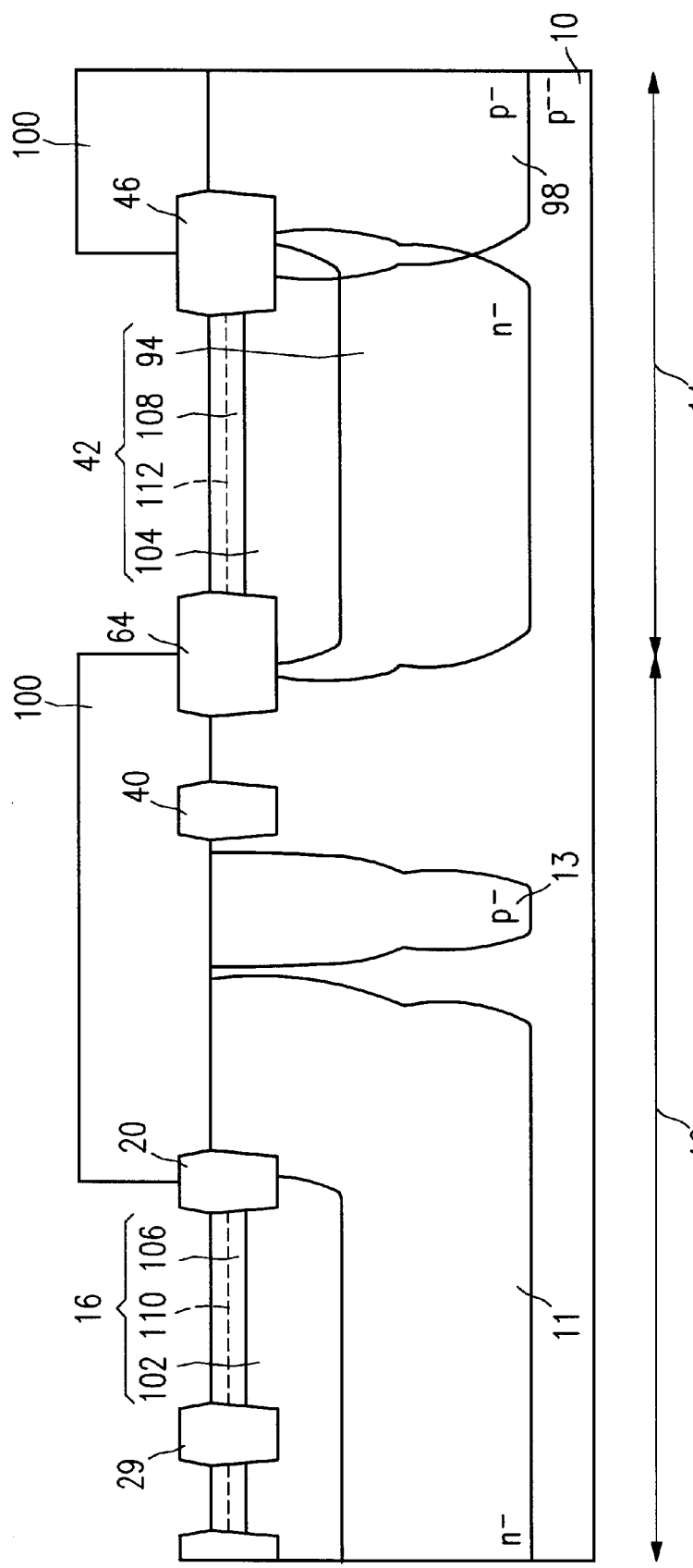
FIG. 7 is a cross-sectional view, which is used to describe a fourth step of a method for manufacturing the semiconductor memory device in accordance with the first embodiment of the present invention.

Referring to FIG. 7, a resist pattern 100 having a thickness in a range of about 1.2 $\mu$m–2.5 $\mu$m is formed such that n-well forming regions in the memory cell region 12 and the peripheral circuit region 14 are exposed. Phosphorous is implanted in the silicon substrate 10, using the resist pattern 100 as a mask, to initially form channel cut layers 102 and 104. The implantation energy ranges from 200 KeV to 500 KeV with a dose ranging from 3E12 to 2E13 cm$^{-2}$.

Next, phosphorous is implanted in the silicon substrate 10, using the resist pattern 100 as a mask, to form punch-through stopper layers 106 and 108. The implantation energy ranges from 100 KeV to 200 KeV with a dose ranging from 2E12 to 2E13 cm$^{-2}$. The punch-through stopper layers 106 and 108 may be formed using arsenic. In this case, the implantation energy ranges from 150 KeV to 300 KeV with a dose ranging from 2E12 to 1E13 cm$^{-2}$.

Then, ions are implanted in the silicon substrate 10, using the resist pattern 100 as a mask, to form channel dope layers 110 and 112. Each of the channel dope layers 110 and 112 may be formed by any one of the following impurities (a), (b) and (c), alone or in combination:

(a) phosphorous (impurity ions): 20 KeV to 100 KeV (implantation energy) with 1E12 to 1E13 cm$^{-2}$ (dose);

(b) boron difluoride (impurity ions): 30 KeV to 100 KeV (implantation energy) with 1E12 to 1E13 cm$^{-2}$ (dose); and (c) boron (impurity ions): 10 KeV to 50 KeV (implantation energy) with 1E12 to 1E13 cm$^{-2}$ (dose).

The above-described steps complete the formation of the n-well 16 including the channel cut layer 102, the punch-through stopper layer 106 and the channel dope layer 110 in the memory cell region 12. In the peripheral circuit region 14, the above-described steps complete the formation of the n-well 42 including the low resistance layer 94, the channel cut layer 104, the punch-through stopper layer 108 and the channel dope layer 112.

Figure 8:
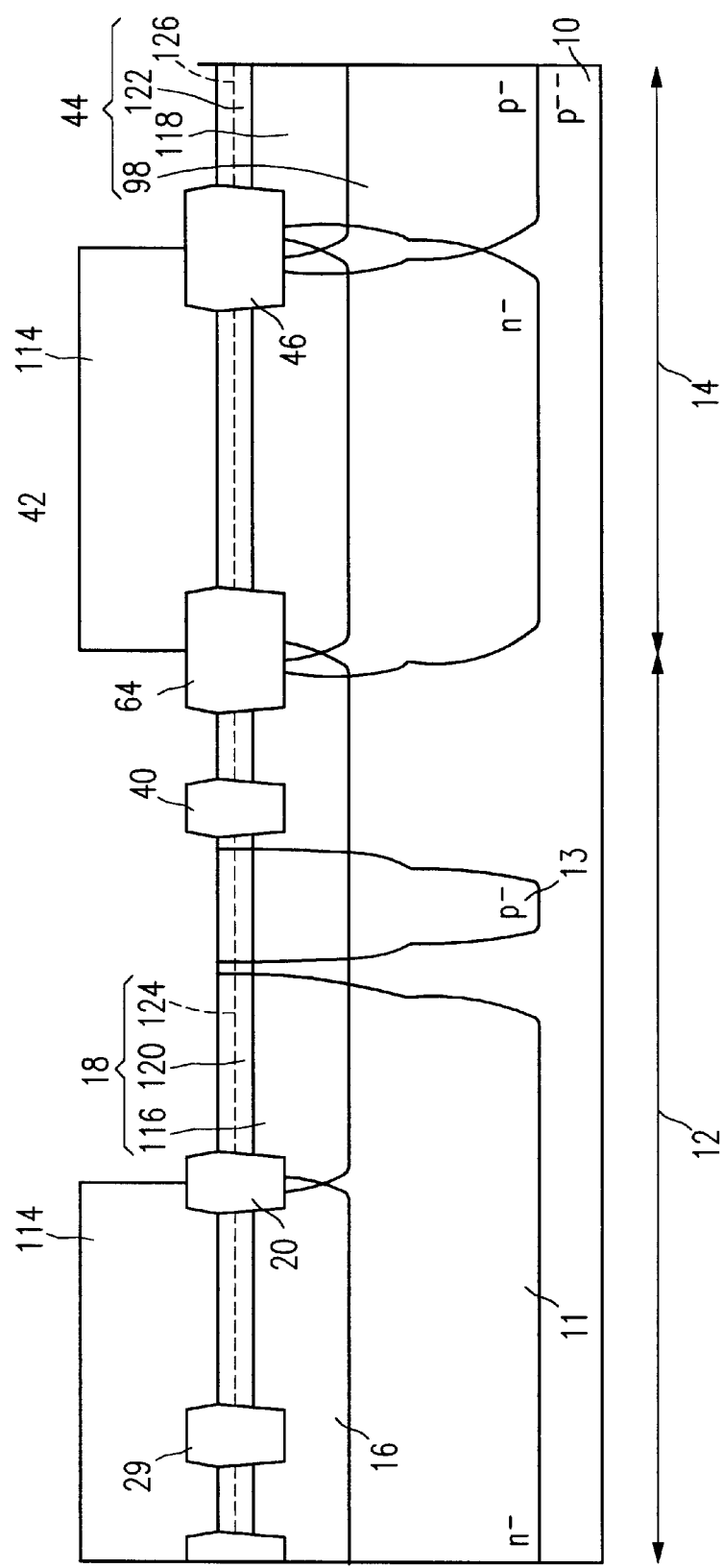
FIG. 8 is a cross-sectional view, which is used to describe a fifth step of a method for manufacturing the semiconductor memory device in accordance with the first embodiment of the present invention.

As shown in FIG. 8, a resist pattern 114 having a thickness in a range of 1.2 μm–2.5 μm is formed such that p-well forming regions in the memory cell region 12 and the peripheral circuit region 14 are exposed. Boron is implanted in the silicon substrate 10, using the resist pattern 114 as a mask, to form channel cut layers 116 and 118. The implantation energy ranges from 100 KeV to 300 KeV with a dose ranging from 3E12 to 2E13 cm$^{-2}$.

Boron is implanted in the silicon substrate 10, using the resist pattern 114 as a mask, to form punch-through stopper layers 120 and 122. The implantation energy ranges from 50 KeV to 200 KeV with a dose ranging from 2E12 to 1E13 cm$^{-2}$. The punch-through stopper layers 120 and 122 overlap with the channel cut layers 116 and 118 depending on the implanting energy. In one embodiment, one layer that functions as the two layers may be formed with one ion implantation.

Then, ions are implanted in the silicon substrate 10, using the resist pattern 114 as a mask, to form channel dope layers 124 and 126. Each of the channel dope layers 124 and 126 may be formed by any one of the following impurities (a), (b) and (c), alone or in combination:

(a) phosphorous (impurity ions): 20 KeV to 100 KeV (implantation energy) with 1E12 to 1E13 cm$^{-2}$ (dose);

(b) boron difluoride (impurity ions): 30 KeV to 150 KeV (implantation energy) with 1E12 to 1E13 cm$^{-2}$ (dose); and (c) boron (impurity ions): 10 KeV to 50 KeV (implantation energy) with 1E12 to 1E13 cm$^{-2}$ (dose).

The above-described steps complete the formation of the p-well 18 including the channel cut layer 116, the punch-through stopper layer 120 and the channel dope layer 124 in the memory cell region 12. In the peripheral circuit region 14, the above-described steps complete the formation of the p-well 44 including the low resistance layer 98, the channel cut layer 118, the punch-through stopper layer 122 and the channel dope layer 126.

Figure 9:
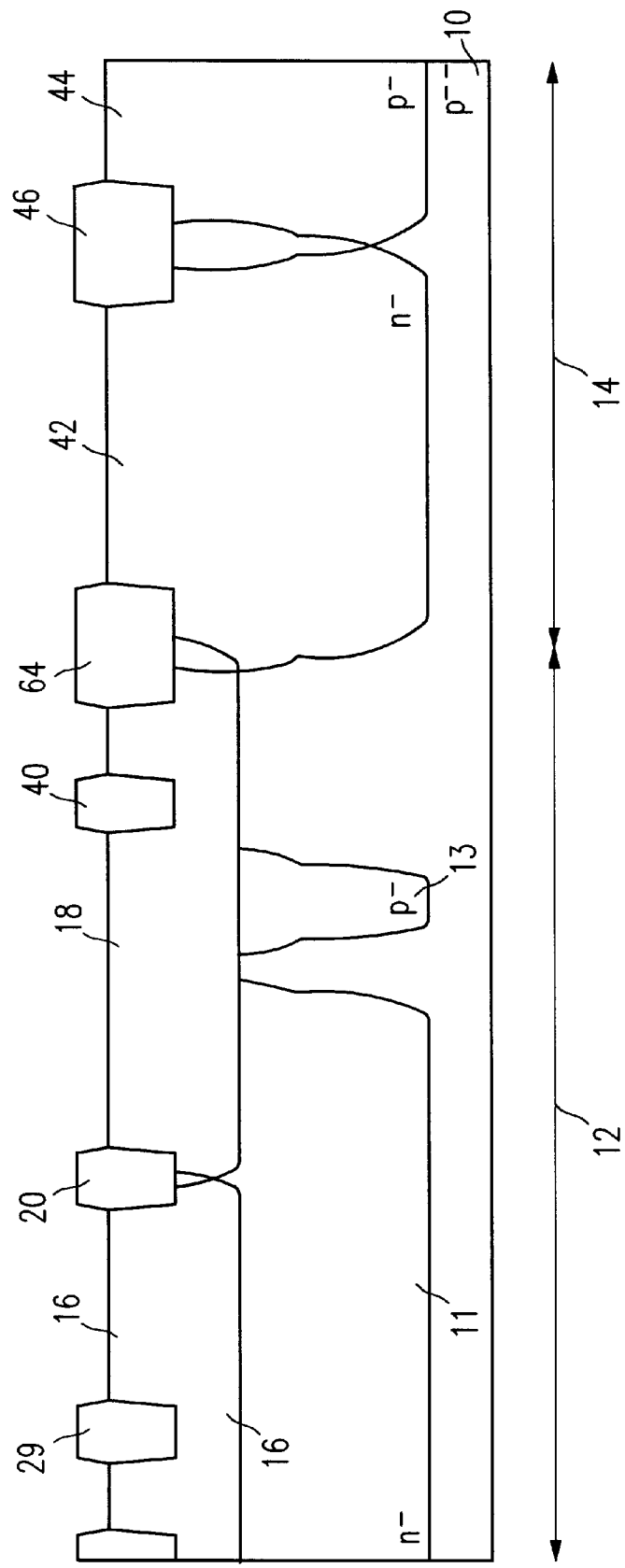
FIG. 9 is a cross-sectional view, which is used to describe a sixth step of a method for manufacturing the semiconductor memory device in accordance with the first embodiment of the present invention.

FIG. 9 shows the silicon substrate 10 in a state in which the resist pattern 114 is removed from the silicon substrate 10 shown in FIG. 8. In FIG. 9, the illustration of lines for the channel cut layers 102, 104, 116 and 118, the punch-through stopper layers 106, 108, 120 and 122, and the channel dope layers 110, 112, 124 and 126 is omitted.

Figure 10:
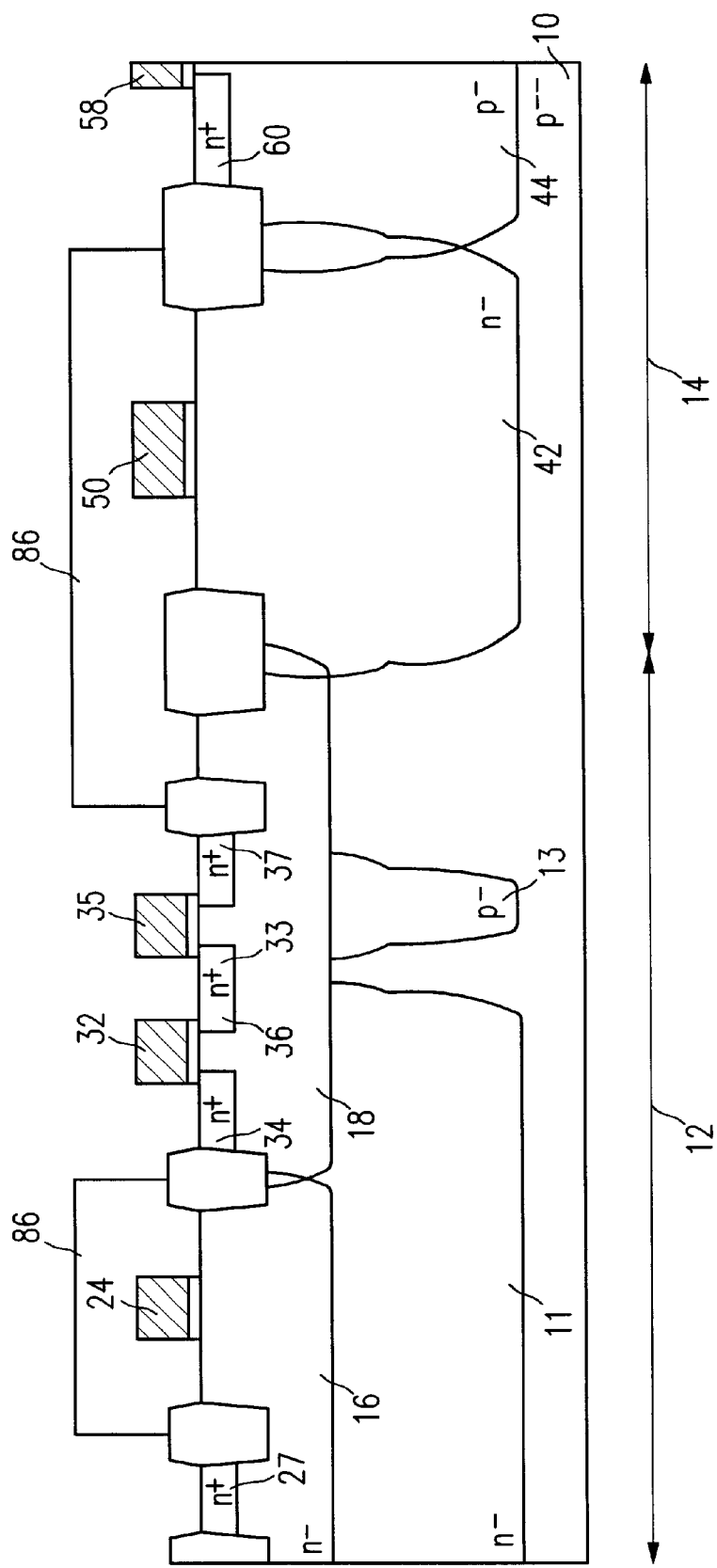
FIG. 10 is a cross-sectional view, which is used to describe a seventh step of a method for manufacturing the semiconductor memory device in accordance with the first embodiment of the present invention.

Referring to FIG. 10, gate electrodes 24, 32, 35, 50 and 58 are formed, using the ordinary gate electrode forming technique. A resist pattern 86 is formed such that n-type source and drain forming regions in the memory cell region 12 and the peripheral circuit region 14, and n-type well contact forming regions in the memory cell region 12, are exposed. For example, phosphorous is implanted in the silicon substrate 10, using the resist pattern 86 and the gate electrodes 32, 35 and 58 as masks, to form a source 34, a drain 36, a source 33, a drain 37, a source/drain 60, and a well contact region 27.

Figure 11:
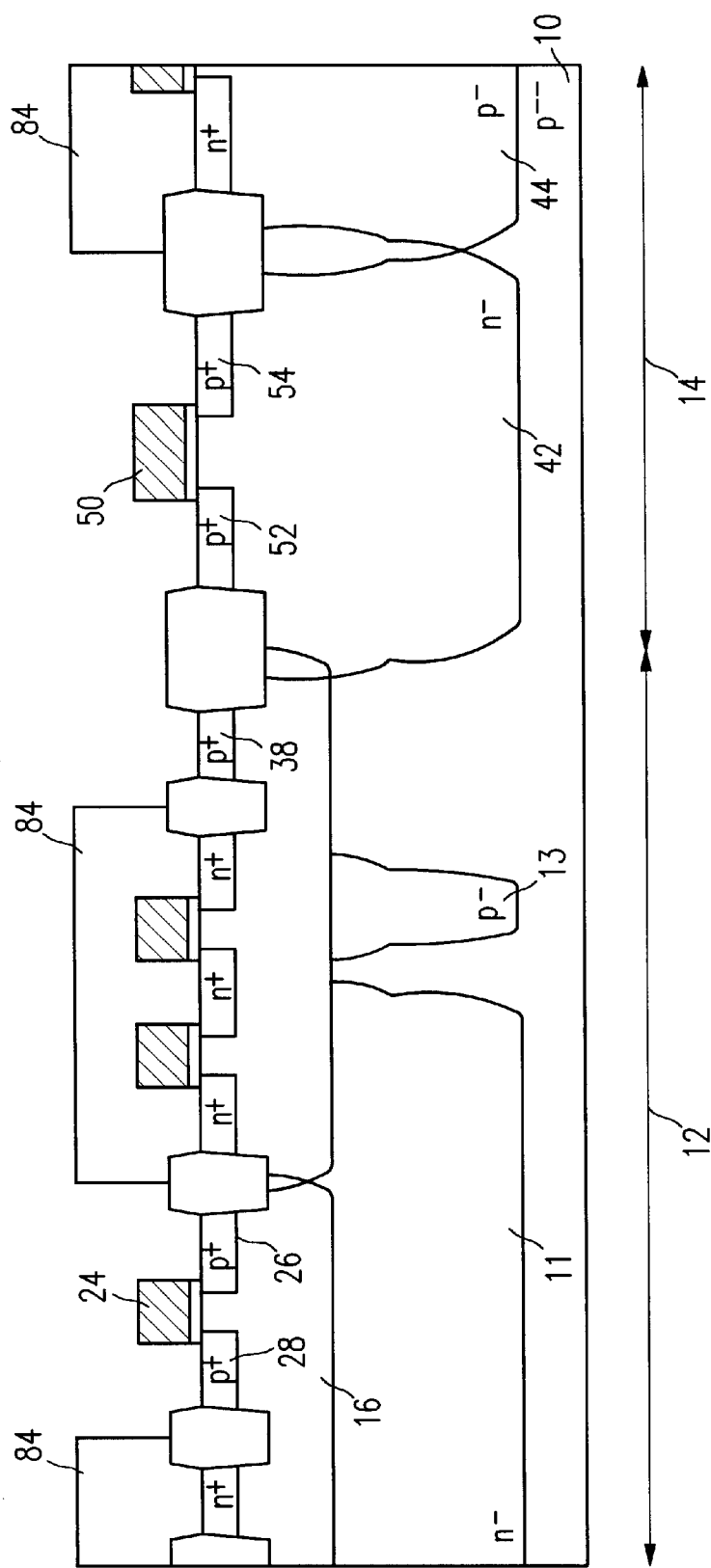
FIG. 11 is a cross-sectional view, which is used to describe a eighth step of a method for manufacturing the semiconductor memory device in accordance with the first embodiment of the present invention.

As shown in FIG. 11, a resist pattern 84 is formed such that p-type source and drain forming regions in the memory cell region 12 and the peripheral circuit region 14, and p-type well contact forming regions in the memory cell region 12, are exposed. For example, boron is implanted in the silicon substrate 10, using the resist pattern 84 and the gate electrodes 24 and 50 as masks, to form a drain 28, a source 26, source/drain 52 and 54, and a well contact region 38. The structure shown in FIG. 1 is completed, using the ordinary wiring connection technique.

{Description of Effects}

(Effect 1)

In the semiconductor memory device 1 as shown in FIG. 1, the first embedded layer 11 is formed under the p-well 18 in an area below a region where the drain 36 of the driver transistor 30 is located, and makes a junction with the p-well 18. Also, the first embedded layer 11 is formed below the n-well 16 and contacts the n-well 16. As a result of this structure, the following effects are obtained.

Figure 2:
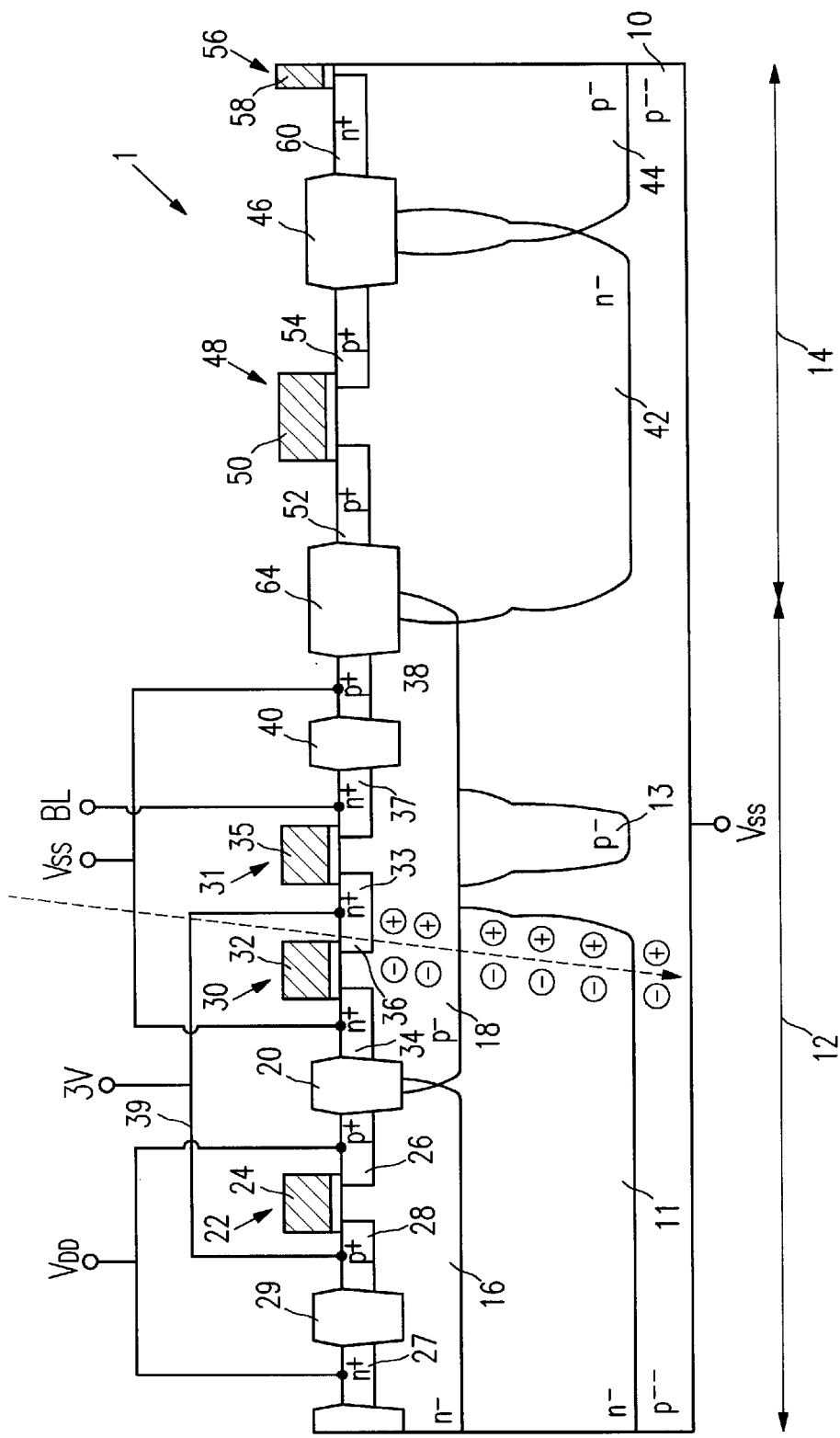
FIG. 2 is a cross-sectional view of a semiconductor memory device, which is used to explain the effects of the semiconductor memory device in accordance with a first embodiment of the present invention.

Referring to FIG. 2, let us assume that, when the cell node is at 3V (namely, when the drain 36 of the driver transistor 30 is at a voltage of 3V), α-ray passes through the drain 36, the p-well 18, the first embedded layer 11 and the silicon substrate 10, and as a result, electron-hole pairs are cut. Let us assume that the ground line $V_{SS}$ is at 0V and the power supply line $V_{DD}$ is at 3V.

Figure 3:
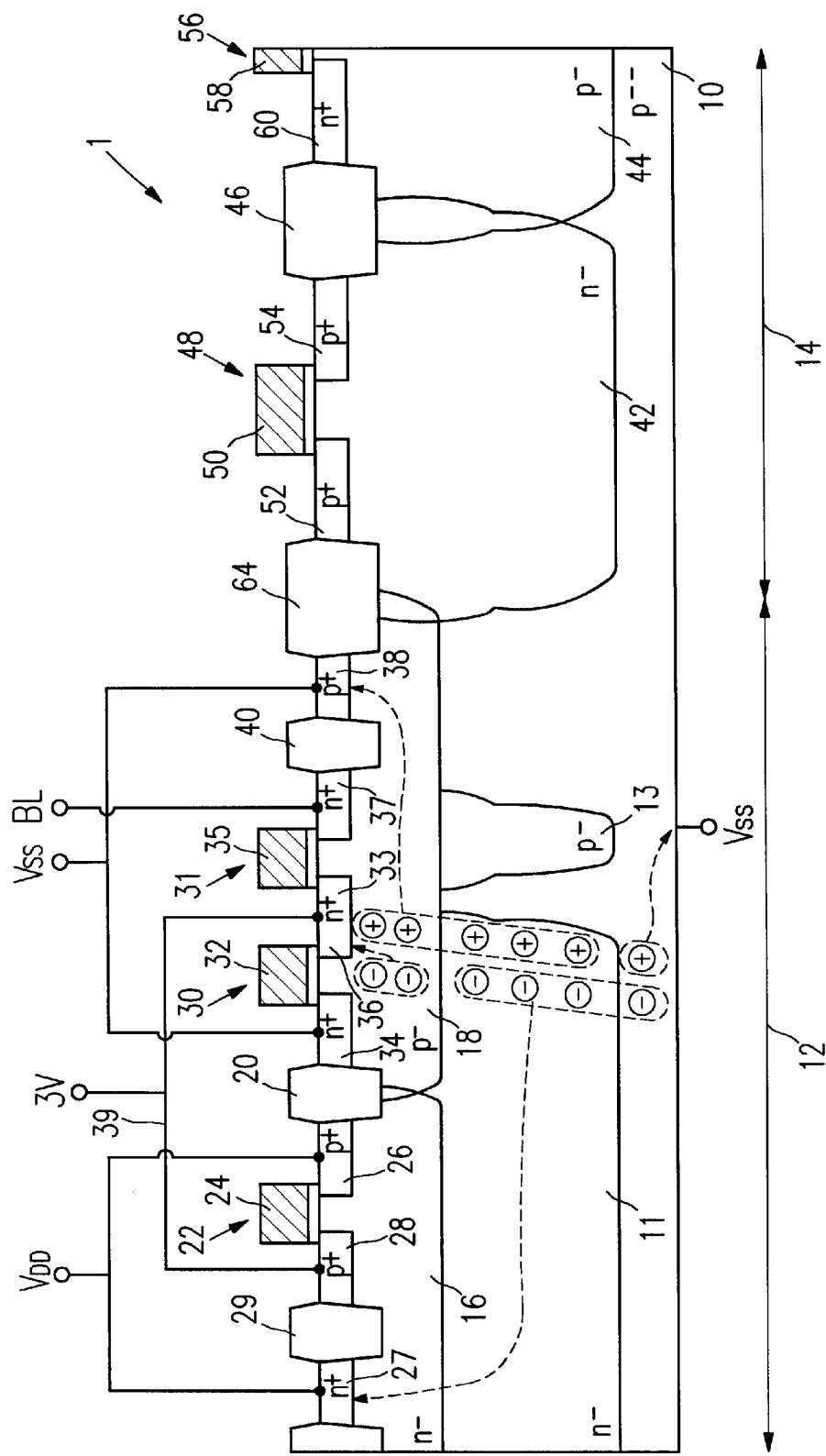
FIG. 3 is a cross-sectional view of a semiconductor memory device, which is used to explain the effects of the semiconductor memory device in accordance with a first embodiment of the present invention.

The well contact region 27 connects to the power supply line $V_{DD}$. Therefore, the first embedded layer 11 has a positive potential (a potential that prevents electrons from flowing in the p-well 18). Accordingly, as shown in FIG. 3, electrons in the first embedded layer 11 and the silicon substrate 10 flow from the first embedded layer 11 through the n-well 16, and are drawn to the well contact region 27. Therefore, only electrons in the p-well 18 are drawn to the drain 36.

Figure 26:
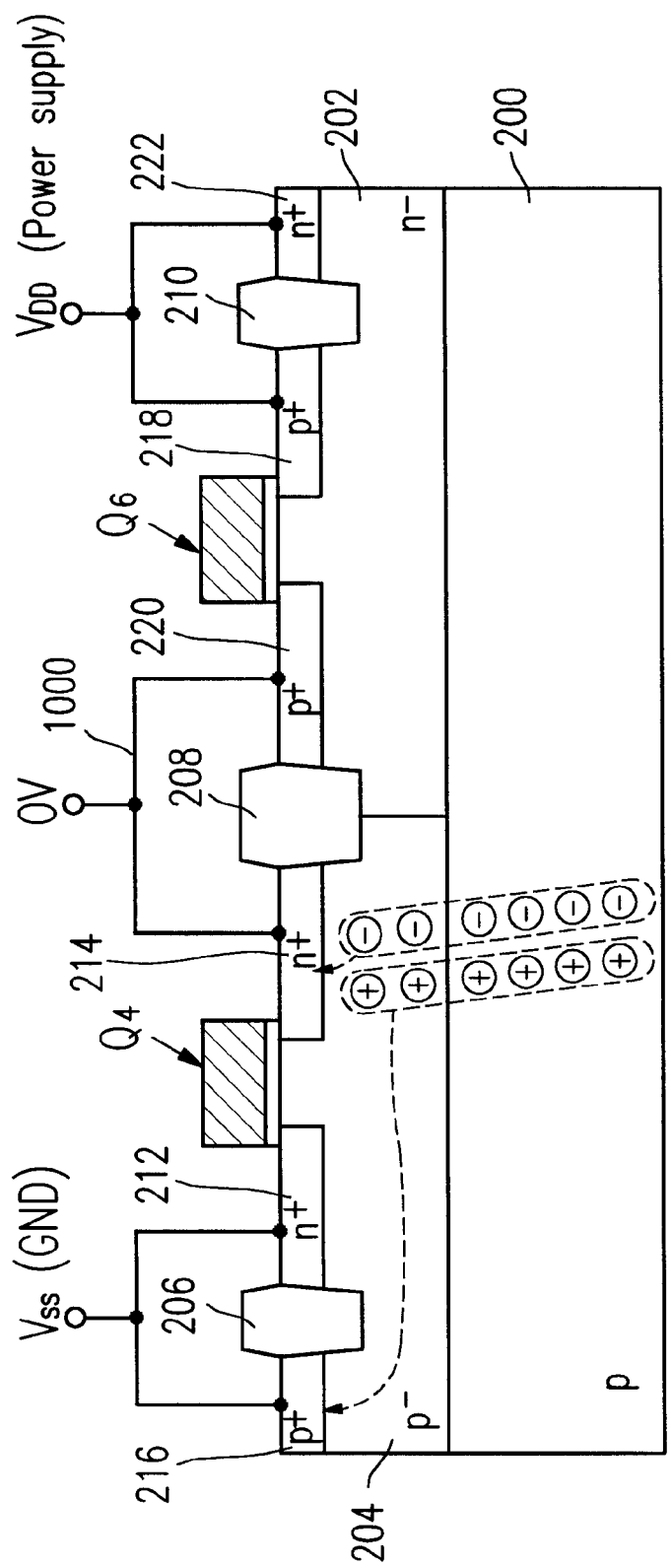
FIG. 26 is a second cross-sectional view, which is used to explain the α-ray soft error in an SRAM.
Figure 27:
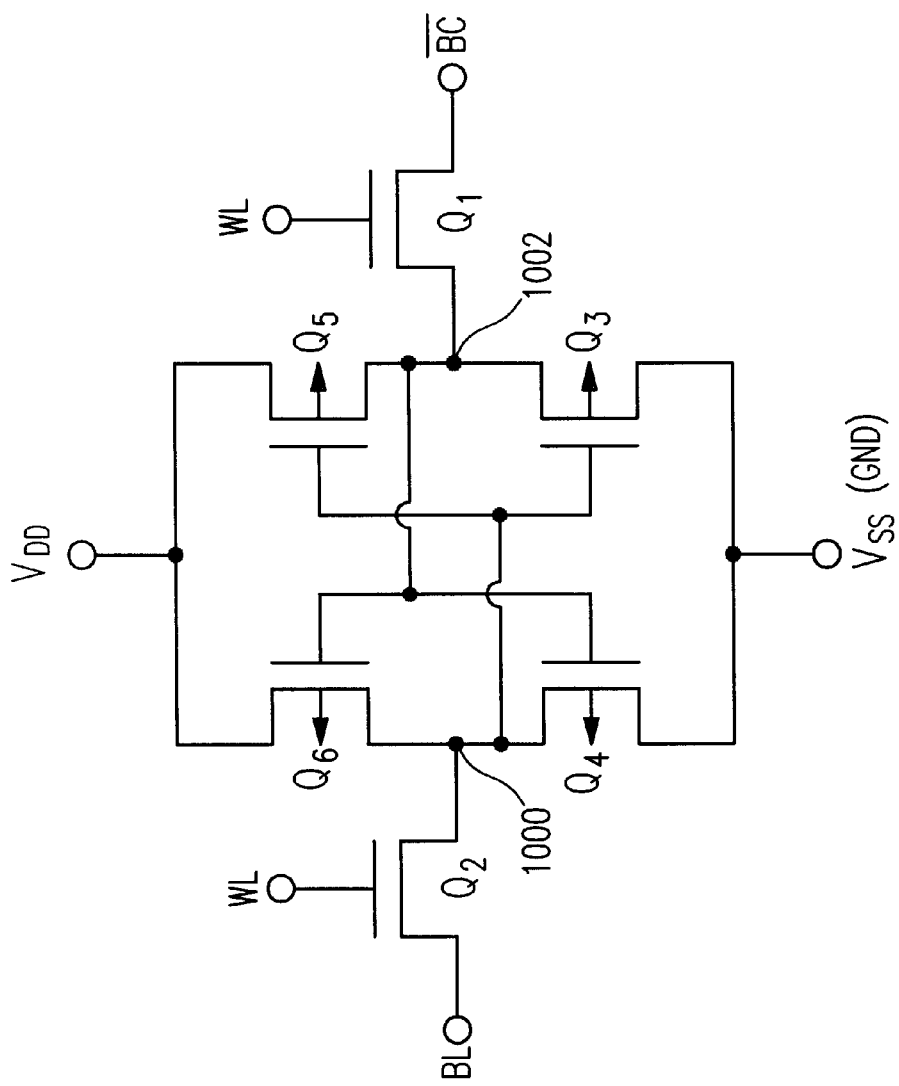
FIG. 27 shows an equivalent circuit of an SRAM.

As shown in FIG. 26, in the conventional semiconductor memory device, all of the electrons along a track in which α-ray passes flow in the drain 214. The distance of the track is equal to the depth of the p-well 204 plus the depth of the silicon substrate 200, which is 20–100 μm. In contrast, in the semiconductor memory device 1 shown in FIG. 3, the distance of the track is equal to only the depth of the p-well 18, which is about 0.5–1.2 μm. As a result, in the semiconductor memory device 1 shown in FIG. 3, the fall of the drain voltage of 3V is smaller. As a result, the retained data is more difficult to be destroyed. Holes are drawn to the ground line $V_{SS}$ that connects to the silicon substrate 10 and the ground line $V_{SS}$ that connects to the well contact region 38. Therefore, they do not cause deteriorating effects on the data retaining function.

It is noted that the first embedded layer 11 may be formed under the p-well 18 and only below a region where the n-type drain 36 is located. Such a structure also provides the same effects as described above. The same effects are obtained by embodiments that will be described below.

By contacting the first embedded layer 11 with the n-well 16, the potential on the first embedded layer 11 is fixed at a value that can prevent electrons in the first embedded layer 11 from flowing into the p-well 18. The first embedded layer 11 may not be contacted with the n-well 16, and may be contacted with another well, to set the first embedded layer 11 at such a potential. The same principle applies to embodiments that will be described below.

(Effect 2)

In the semiconductor memory device 1 shown in FIG. 1, the p-type second embedded layer 13 is provided below the p-well 18. As a result, the resistance of the p-well 18 can be lowered. This contributes to the prevention of the generation of latchup.

(Effect 3)

As shown in FIG. 1, the silicon substrate 10 is of p-type. Therefore, the p-wells in the memory cell region 12 connect to one another through the silicon substrate 10, so that the well resistance is lowered. As a result, a rise of the substrate potential can be reduced in a region that forms the n-channel transistor that has a relatively large substrate current compared to the p-channel transistor in the memory cell region 12.

(Effect 4)

In the semiconductor memory device 1, as shown in FIG. 1, the depth of the n-well 16 and the p-well 18 in the memory cell region 12 is smaller than the depth of the n-well 42 and the p-well 44 in the peripheral circuit region 14. This structure lowers the possibility of generation of latch-up, and reduces the length of the device element isolation structure (semi-recessed LOCOS oxide film 20) between the n-well 16 and the p-well 18 in the memory cell region 12. The reasons will be described below.

(A) The latch-up occurs when the product of a leak current of a parasitic MOS or a substrate current with the substrate resistance becomes a certain value or greater. To reduce the substrate resistance, deep wells need to be formed. Since the thickness of a resist pattern is proportional to the depth of a well, the resist pattern needs to be thicker in order to form a deeper well.

However, if wells are formed by thick resist patterns, for example, the n-well 42 and the p-well 44 overlap each other in a large area below the semi-recessed LOCOS oxide film 46 in the peripheral circuit region 14, as shown in FIG. 1. The reason for this will be discussed with reference to FIG. 12.

Figure 12:
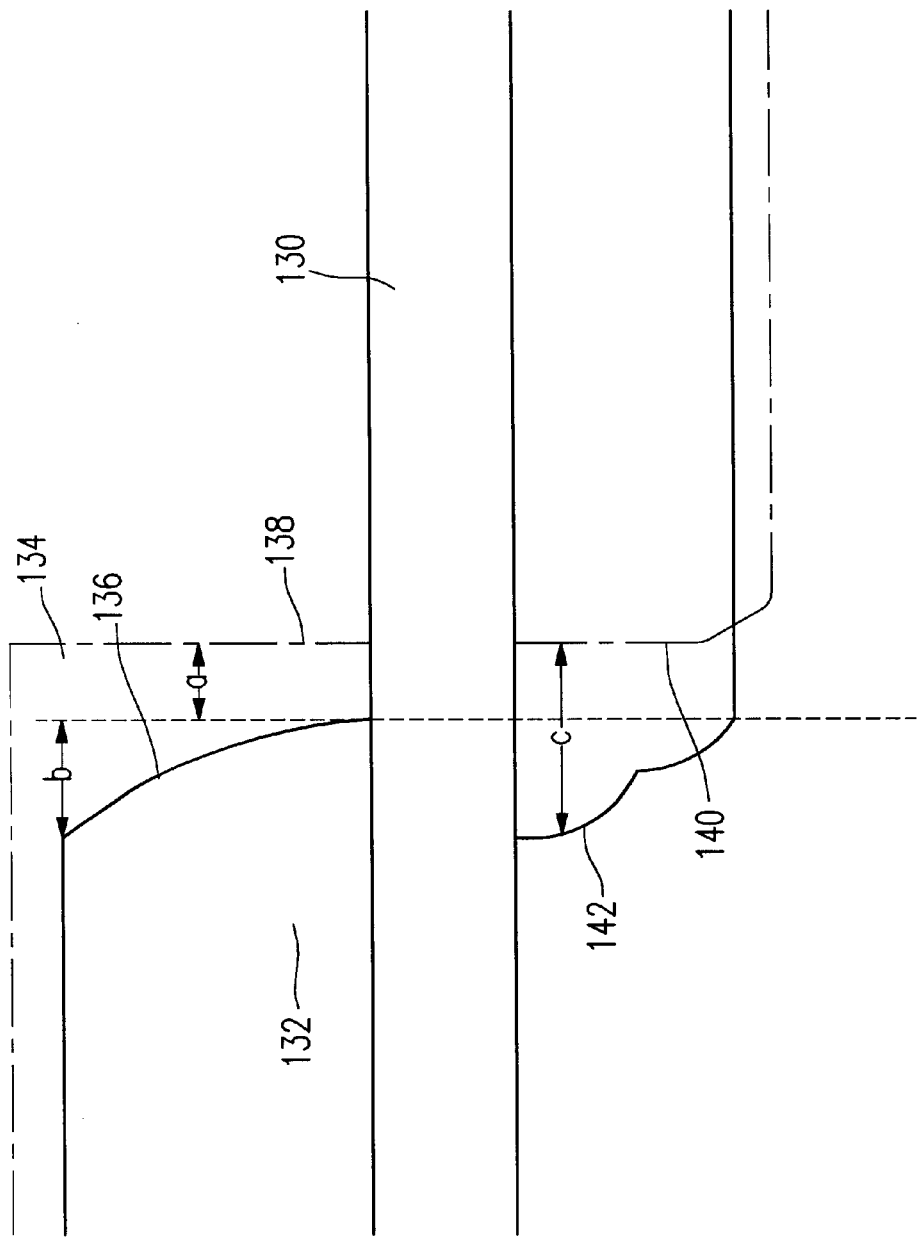
FIG. 12 is a cross-sectional view, which is used to describe changes in the shape of a resist pattern.

(B) FIG. 12 shows a state in which the resist pattern 132 is formed on the device element isolation structure 130. FIG. 12 shows a resist end portion 136, namely, an end portion of the resist pattern 132. FIG. 12 also shows a designed resist pattern 134 having a designed resist end portion 138.

The letter a represents a receding distance due to the proximity effect and loading effect. The letter b represents shrinkage at the upper edge of the resist when the resist pattern is baked. The top edge of the resist end portion 136 recedes by an amount of a+b from the resist end portion 138.

Figure 13:
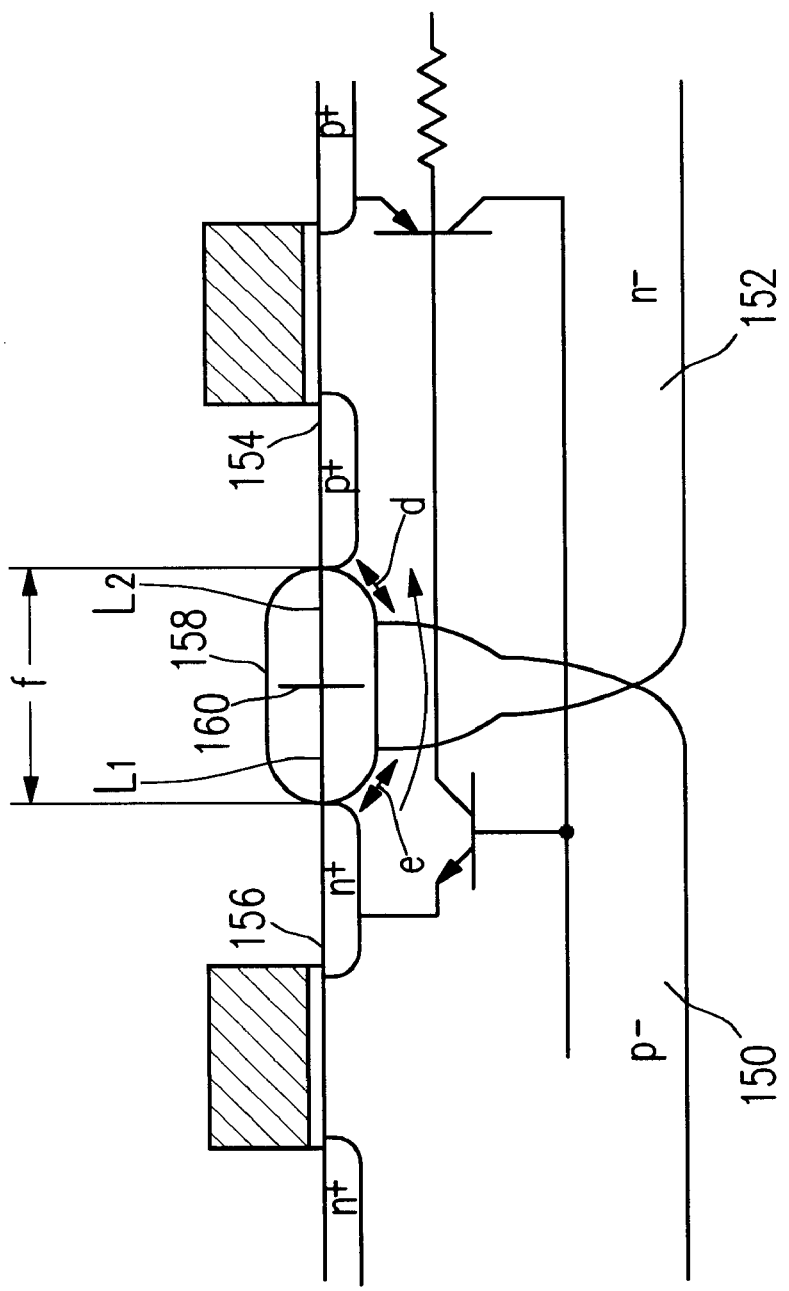
FIG. 13 is a cross-sectional view, which is used to describe a latchup phenomenon.

Reference numeral 140 denotes a well end portion when the well is to be formed with the designed resist pattern 134 as a mask. Reference numeral 142 denotes a well end portion when the well is actually formed with the resist pattern 132 as a mask. The upper edge of the well end portion 142 advances by an amount c from the upper edge of the well end portion 140 under the influence of the recession of the top edge of the resist end portion 136. This increases the intrusion of ions into the adjacent well, thereby expanding the overlapped area. The effect of this expanded overlapped area is discussed with reference to FIG. 13.

When a p-well 150 and an n-well 152 overlap each other in a large area, as shown in FIG. 8, one or both of the distance d between a p-type source/drain 154 and the p-well 150 and the distance e between an n-type source/drain 156 and the n-well 152 is shortened depending on the amount of ion implantation dose during the well formation. When this distance shortens, for example, when the distance e shortens, a leakage current of a parasitic MOS transistor tends to flow to the n-well 152 from the n-type source/drain 156 through the p-well 150. This is attributable to a shortened effective channel length of the parasitic MOS transistor. The leakage current in the parasitic MOS transistor may work as a trigger current for latchup.

If a well is formed using a thin resist pattern, for example, having a thickness of about 2 $\mu$m or less, the overlapped area becomes to be relatively small. This is because neither the receding distance a at the resist end portion nor the shrinkage b at the top end edge of the resist occur in the end portion of the resist pattern.

When the length f of the device element isolation structure 158 is made greater, the distances d and e may not become shorter. In the peripheral circuit region having space margin available, the length f of the device element isolation structure 158 may be made greater. However, if the length f of the device element isolation structure 158 is made greater in the memory cell region where no additional space is available, the miniaturization of the memory cell may not be achieved.

(C) The substrate current is relatively large in the peripheral circuit region, because transistors having wide channel widths and large drivability are arranged in the peripheral circuit region. To prevent latchup, the substrate resistance needs to be reduced. For this reason, the well depth has to be increased in the peripheral circuit region. On the other hand, the substrate current is relatively small in the memory cell region, because the size of a transistor constituting a memory cell is small. As a result, the latchup is prevented without greatly reducing the substrate resistance. Therefore, the depth of a well can be made small in the memory cell.

For the reasons discussed above, the well depth is set to be shallow in the memory cell region. This reduces an overlap between the p-well and the n-well, and reduces the possibility of the generation of latchup.

[Second Embodiment]

{Description of Device Structure}

Figure 14:
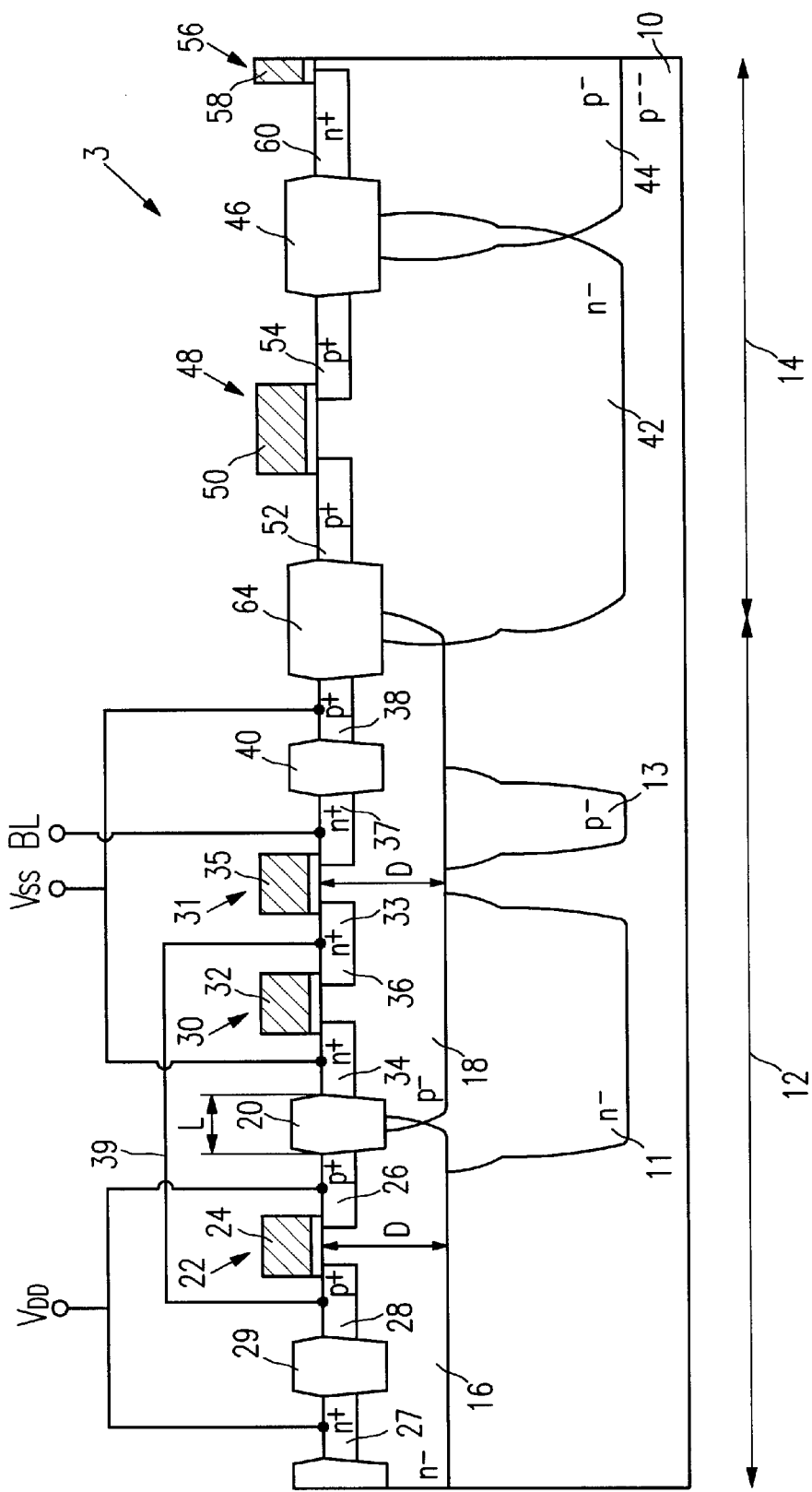
FIG. 14 is a cross-sectional view of a semiconductor memory device in accordance with a second embodiment of the present invention.

FIG. 14 is a cross-sectional view of a semiconductor memory device in accordance with a second embodiment of the present invention. In a semiconductor memory device 3 shown in FIG. 14, the same reference numerals are used for elements having the same functions as those of the elements of the semiconductor memory device 1 in accordance with the first embodiment of the present invention shown in FIG. 1. The semiconductor memory device 3 is different from the semiconductor memory device 1 in some respects. The differences will be described below, but the description of the elements having the same functions will be omitted.

A first embedded layer 11 is formed below a p-well 18 and an n-well 16, and extends from an area where a gate electrode 35 is located to an area where a semi-recessed LOCOS oxide film 20 is located. The first embedded layer 11 is not formed in an area under the n-well 16 where the p-type drain 28 is located. Also, the first embedded layer 11 has an n-type impurity of a low concentration.

Since the first embedded layer 11 is formed in an area extending to a location below the gate electrode 35, a second embedded layer 13 is formed in an area shifted accordingly. Also, the second embedded layer 13 has a p-type impurity of a low concentration.

{Description of Method for Manufacturing Device}

A method for manufacturing the semiconductor memory device 3 in accordance with a second embodiment of the present invention will be described with reference to FIGS. 17–23.

In a similar manner conducted for manufacturing the semiconductor memory device 1 of the first embodiment, the step described with reference to FIG. 4 is conducted.

Figure 17:
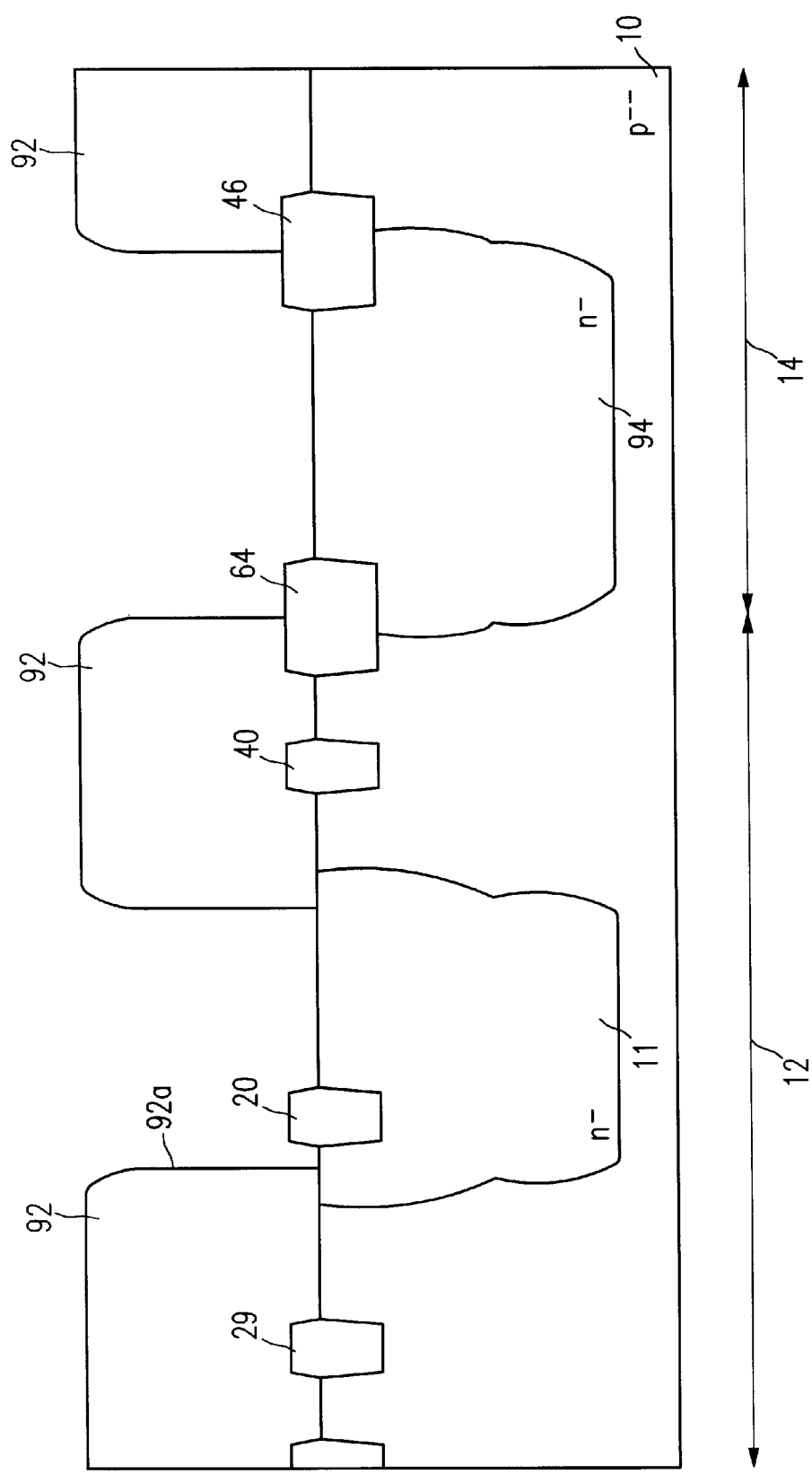
FIG. 17 is a cross-sectional view, which is used to describe a first step of a method for manufacturing the semiconductor memory device in accordance with the second embodiment of the present invention.

Then, a step shown FIG. 17 is conducted. The step shown in FIG. 17 corresponds to the step shown in FIG. 5. However, the opening 92a of the resist pattern 92 is used for forming the first embedded layer 11 of the semiconductor memory device 3. Ions are implanted in the silicon substrate 10, using the resist pattern 92 as a mask, to form the low resistance layer 94 and the first embedded layer 11. The same forming conditions described with reference to FIG. 5 are used.

Figure 18:
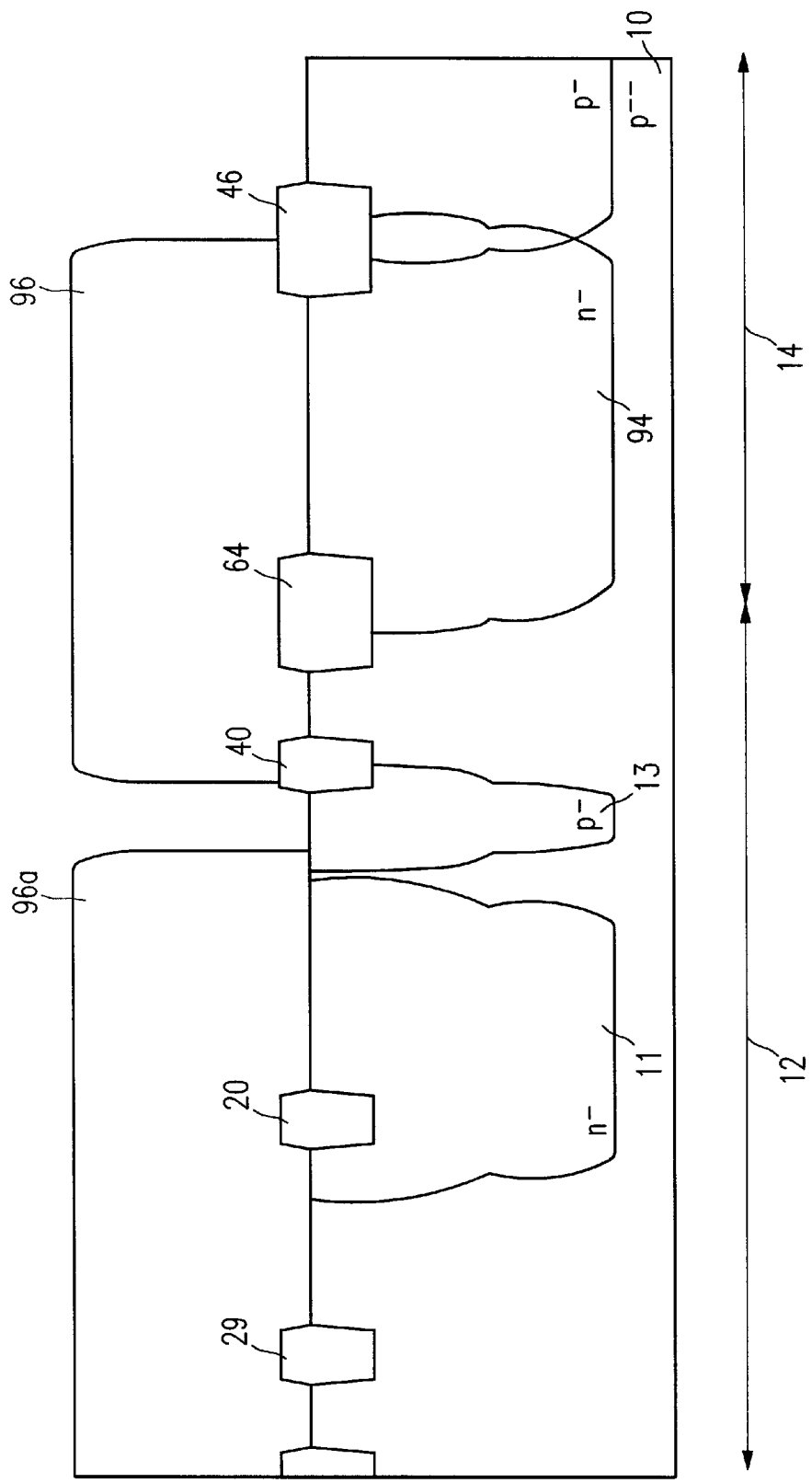
FIG. 18 is a cross-sectional view, which is used to describe a second step of a method for manufacturing the semiconductor memory device in accordance with the second embodiment of the present invention.

Then, a step shown in FIG. 18 is conducted. The step shown in FIG. 18 corresponds to the step shown in FIG. 6. However, the opening 96a of the resist pattern 96 is used for forming the third embedded layer 13 of the semiconductor memory device 3. Ions are implanted in the silicon substrate 10, using the resist pattern 96 as a mask, to form the low resistance layer 98 and the second embedded layer 13. The same forming conditions described with reference to FIG. 6 are used.

Figure 19:
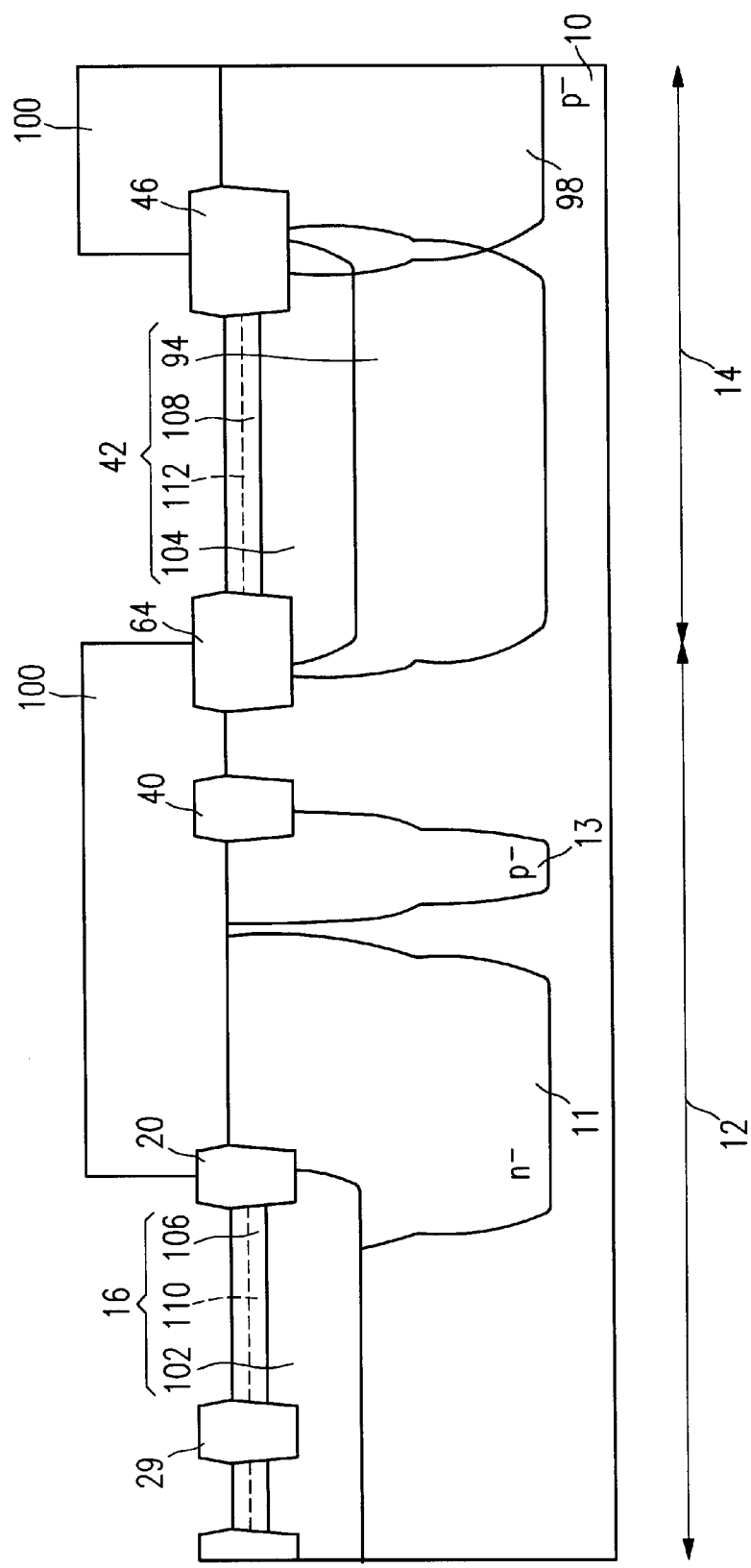
FIG. 19 is a cross-sectional view, which is used to describe a third step of a method for manufacturing the semiconductor memory device in accordance with the second embodiment of the present invention.

Next, a step shown in FIG. 19 is conducted. The step shown in FIG. 19 is the same as the step shown in FIG. 7. Accordingly, the description thereof is omitted.

Figure 20:
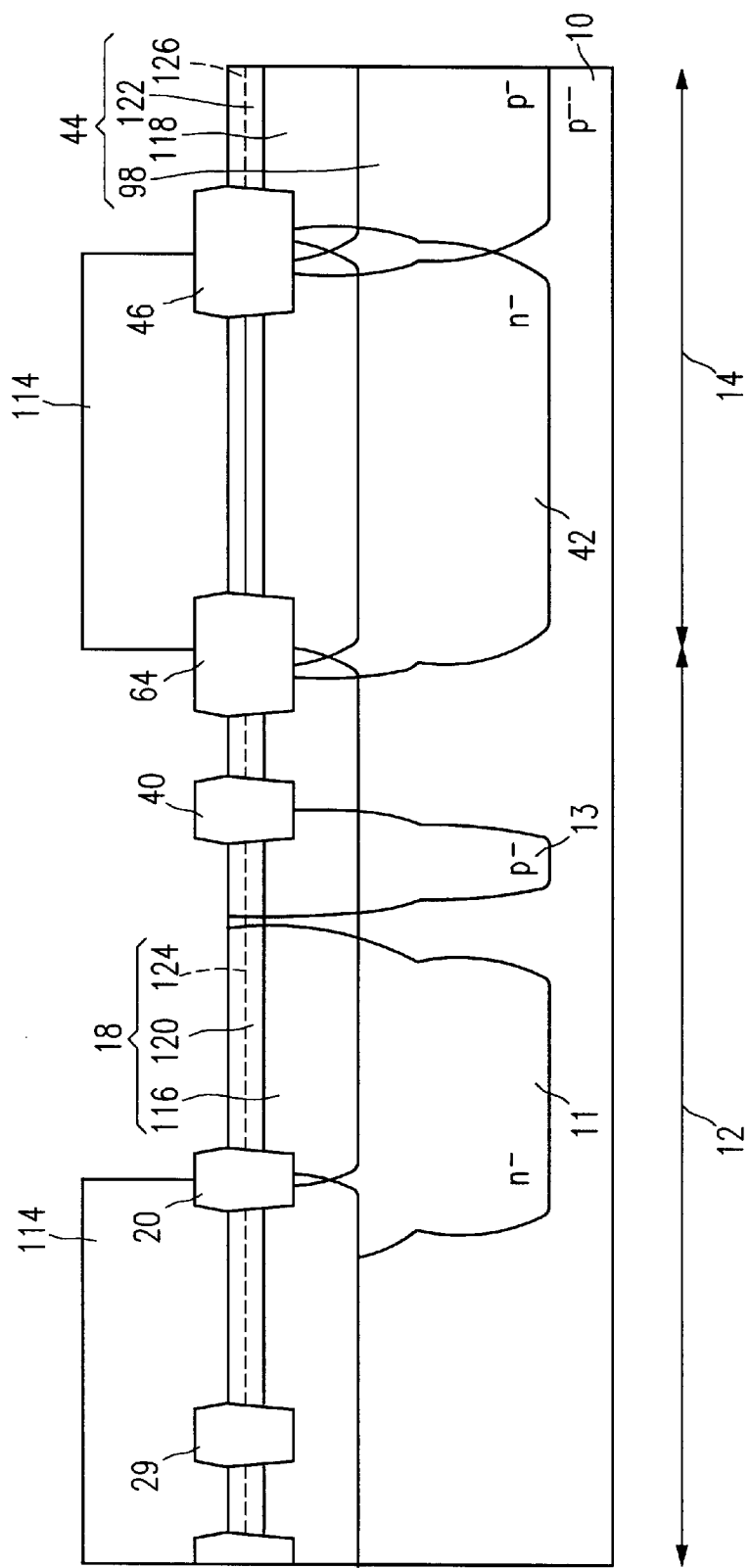
FIG. 20 is a cross-sectional view, which is used to describe a fourth step of a method for manufacturing the semiconductor memory device in accordance with the second embodiment of the present invention.

Next, a step shown in FIG. 20 is conducted. The step shown in FIG. 20 is the same as the step shown in FIG. 8. Accordingly, the description thereof is omitted.

Figure 21:
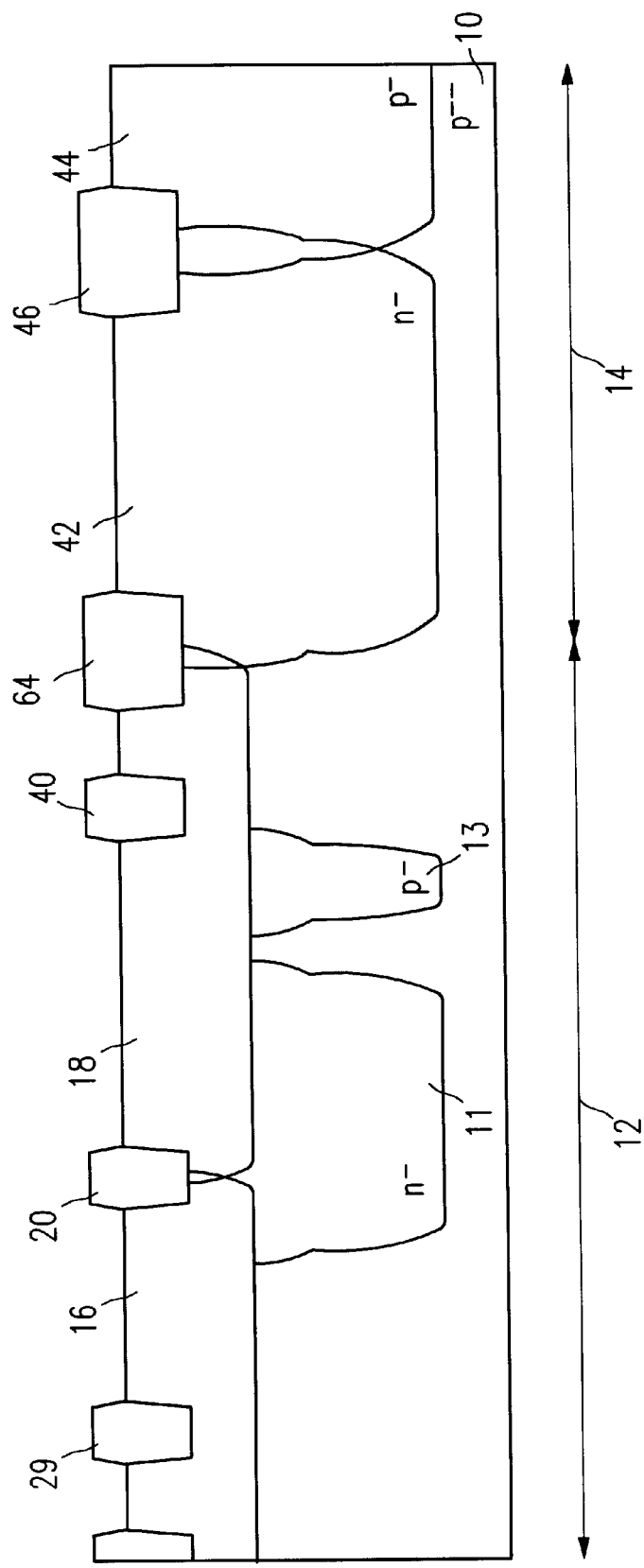
FIG. 21 is a cross-sectional view, which is used to describe a fifth step of a method for manufacturing the semiconductor memory device in accordance with the second embodiment of the present invention.

Next, a step shown in FIG. 21 is conducted. The step shown in FIG. 21 is the same as the step shown in FIG. 9. Accordingly, the description thereof is omitted.

Figure 22:
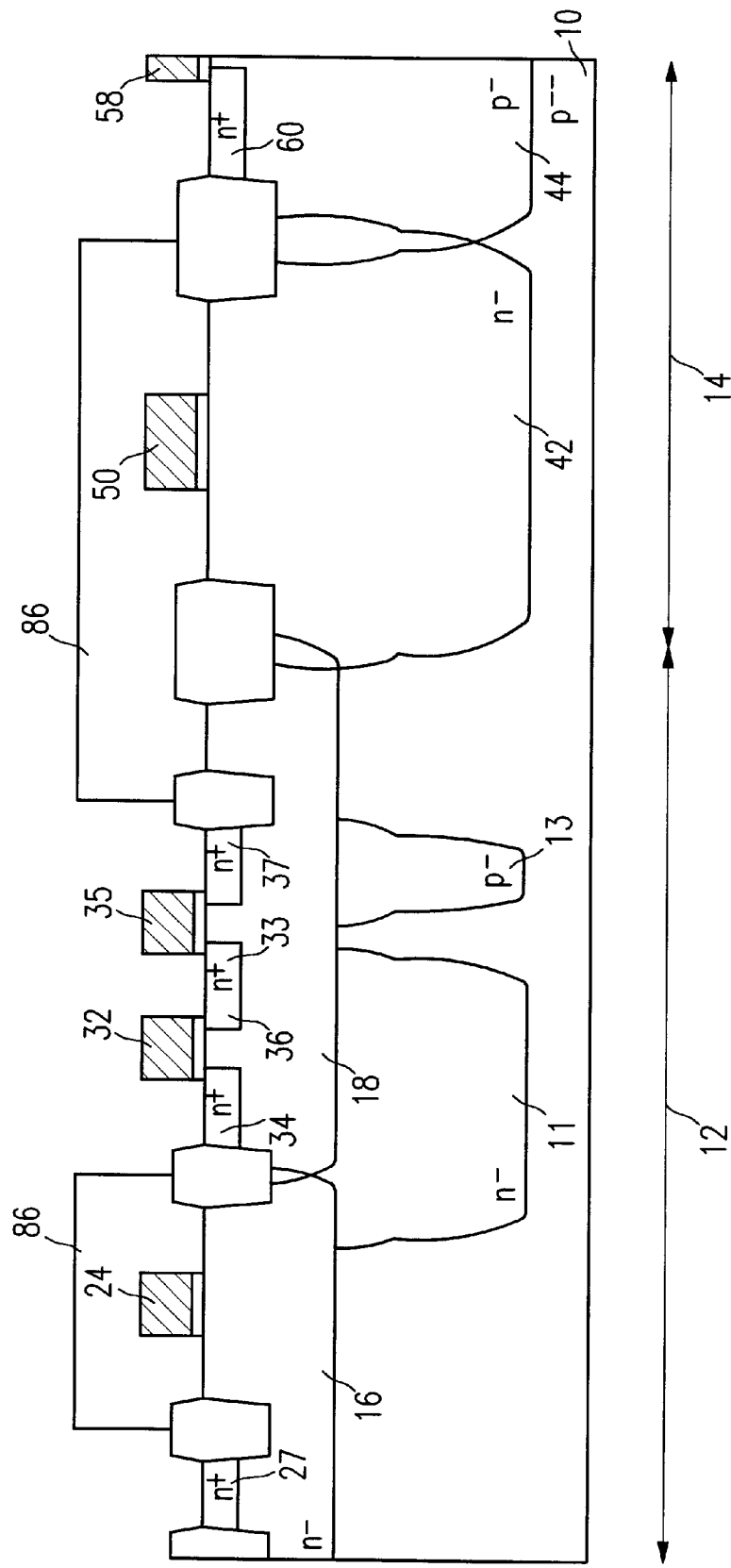
FIG. 22 is a cross-sectional view, which is used to describe a sixth step of a method for manufacturing the semiconductor memory device in accordance with the second embodiment of the present invention.

Next, a step shown in FIG. 22 is conducted. The step shown in FIG. 22 is the same as the step shown in FIG. 10. Accordingly, the description thereof is omitted.

Figure 23:
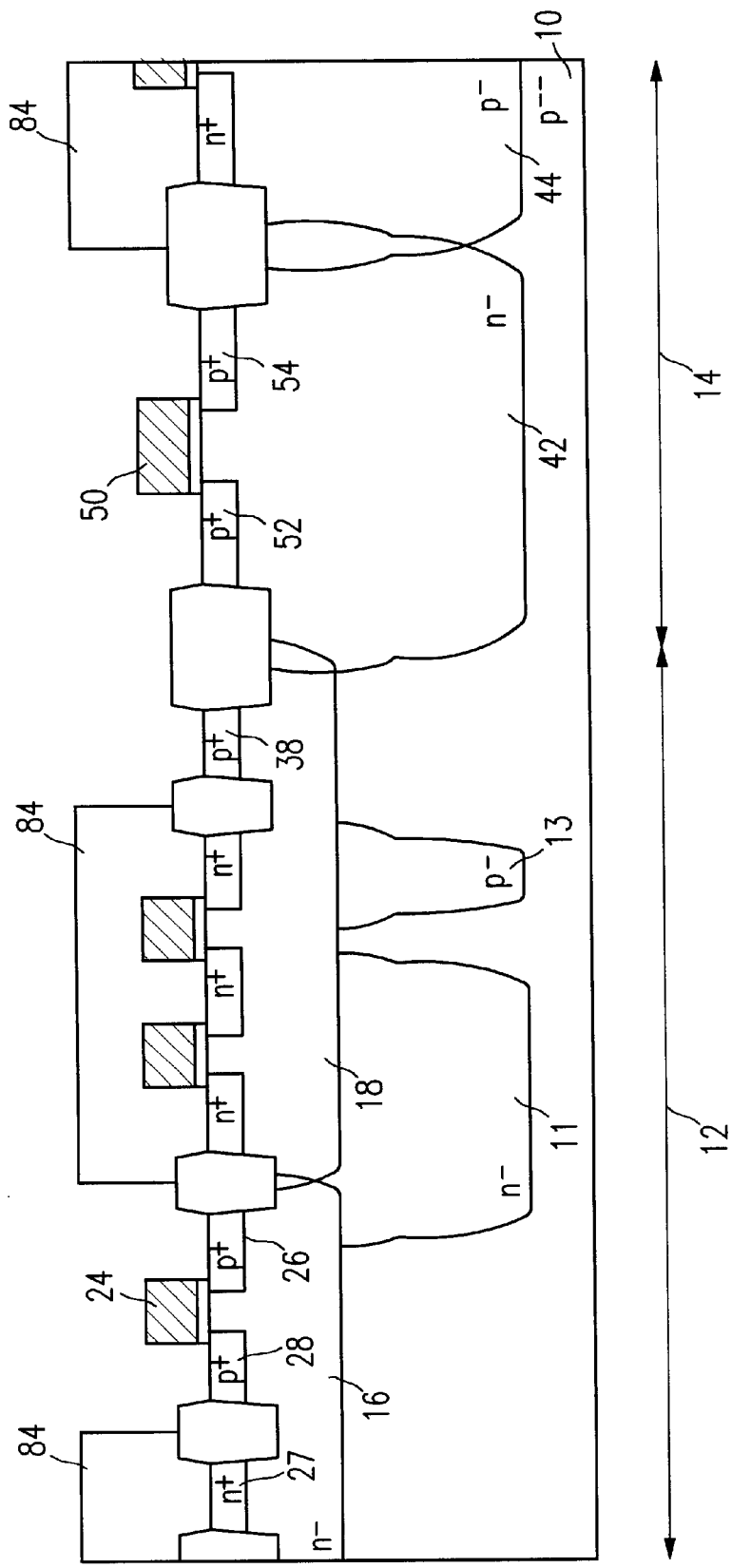
FIG. 23 is a cross-sectional view, which is used to describe a seventh step of a method for manufacturing the semiconductor memory device in accordance with the second embodiment of the present invention.

Next, a step shown in FIG. 23 is conducted. The step shown in FIG. 23 is the same as the step shown in FIG. 11. Accordingly, the description thereof is omitted. The ordinary wiring connection technique is used to complete the semiconductor memory device 3 shown in FIG. 14.

{Description of Effects}

The semiconductor memory device 3 of the second embodiment achieves substantially the same effects (i.e., Effect 1–Effect 4) achieved by the semiconductor memory device of the first embodiment described above. In addition, the following effects are also attained.

The semiconductor memory device 3 shown in FIG. 14 can prevent the α-ray soft error that may be generated in the drain 28 of the load transistor 22 (that is an element composing a cell node 39). This phenomenon will be described with reference to FIG. 15 and FIG. 16.

Figure 15:
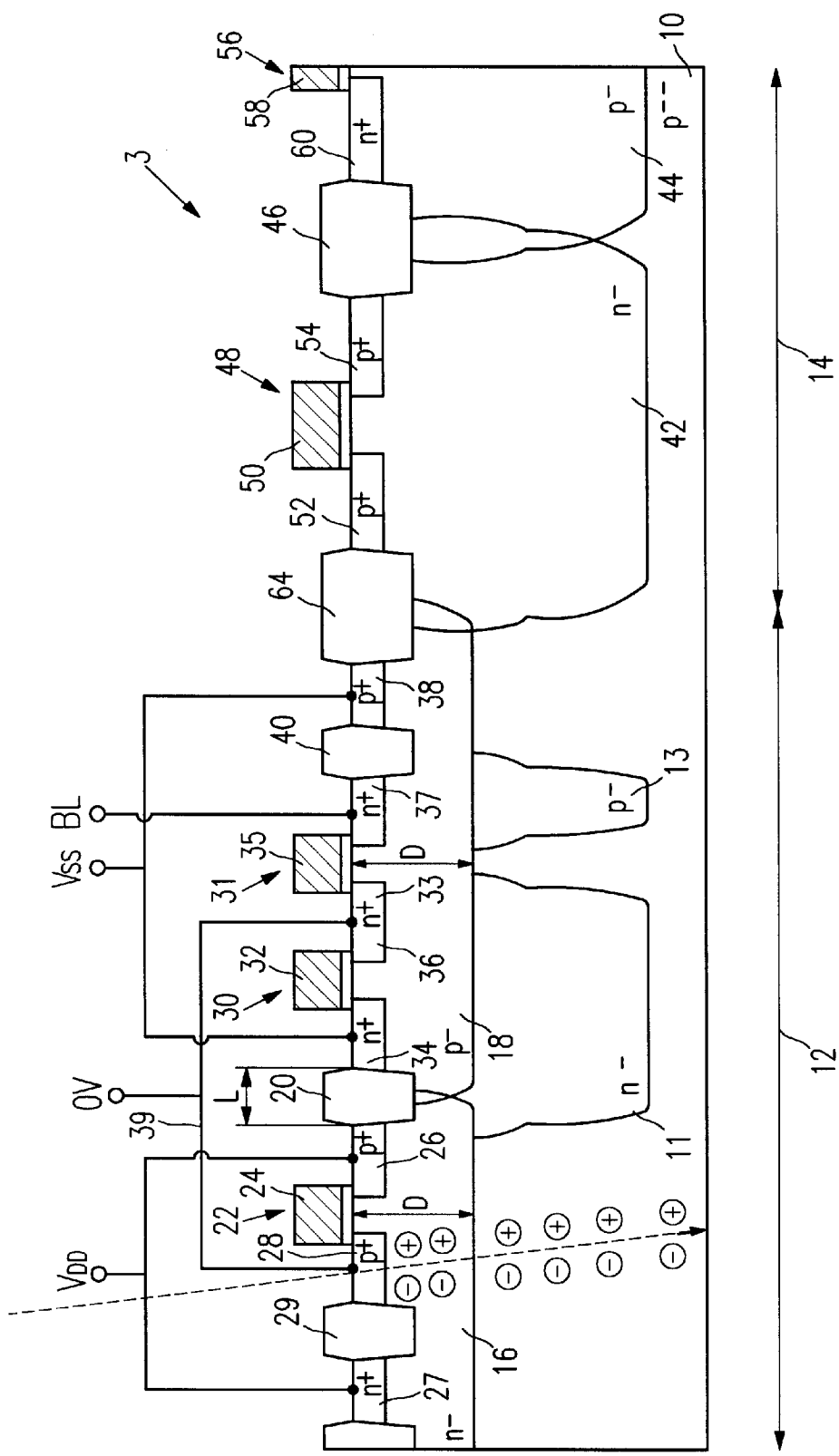
FIG. 15 is a cross-sectional view of a semiconductor memory device, which is used to explain the effects of the semiconductor memory device in accordance with the second embodiment of the present invention.

As shown in FIG. 15, let us assume that the cell node 39 is at 0V (in other words, the drain 28 of the load transistor 22 is at 0V). Since the drain 28 is at 0V, and the n-well 16 is biased to the power supply line $V_{DD}$ through the well contact region 27, a depletion layer is formed in a junction area between the drain 28 and the n-well 16. Let us assume that α-ray is injected in this state. The α-ray passes through the n-well 16 and the silicon substrate 10, and electron-hole pairs would be cut. The silicon substrate 10 is biased to the ground line $V_{SS}$.

Figure 16:
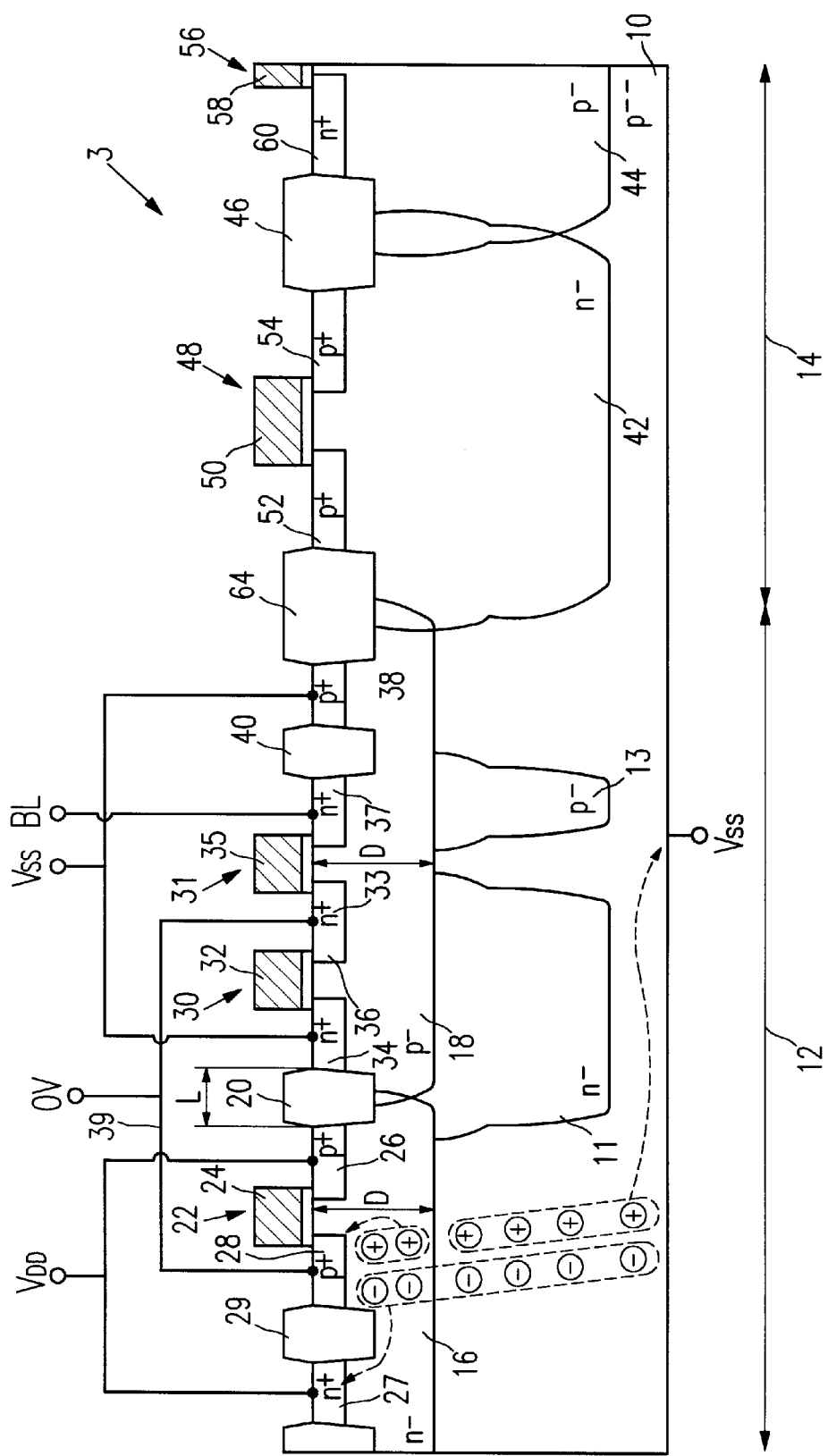
FIG. 16 is a cross-sectional view of a semiconductor memory device, which is used to explain the effects of the semiconductor memory device in accordance with the second embodiment of the present invention.

As shown in FIG. 16, holes in the silicon substrate 10 are drawn to the ground line $V_{SS}$. The holes that are drawn to the drain 28 are those in the n-well 16. The depth of the n-well 16 in the semiconductor memory device 3 is about 0.5–1.2 μm. As a result, a rise in the potential of the drain region 28 can be reduced. For the reasons described above, the retained data is difficult to be destroyed even when the cell node 39 is at 0V.

[Third Embodiment]

Figure 24:
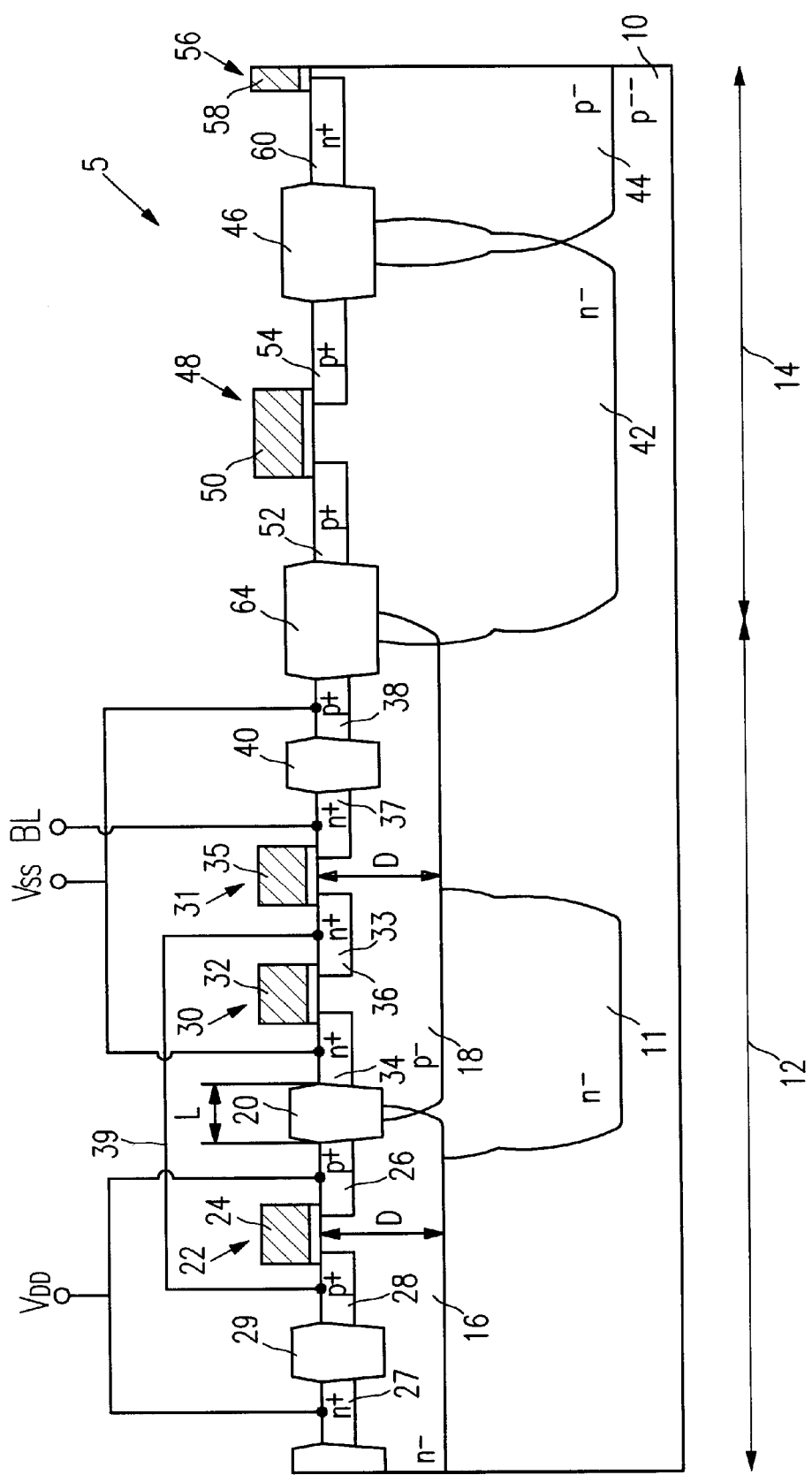
FIG. 24 is a cross-sectional view of a semiconductor memory device in accordance with a third embodiment of the present invention.
Figure 25:
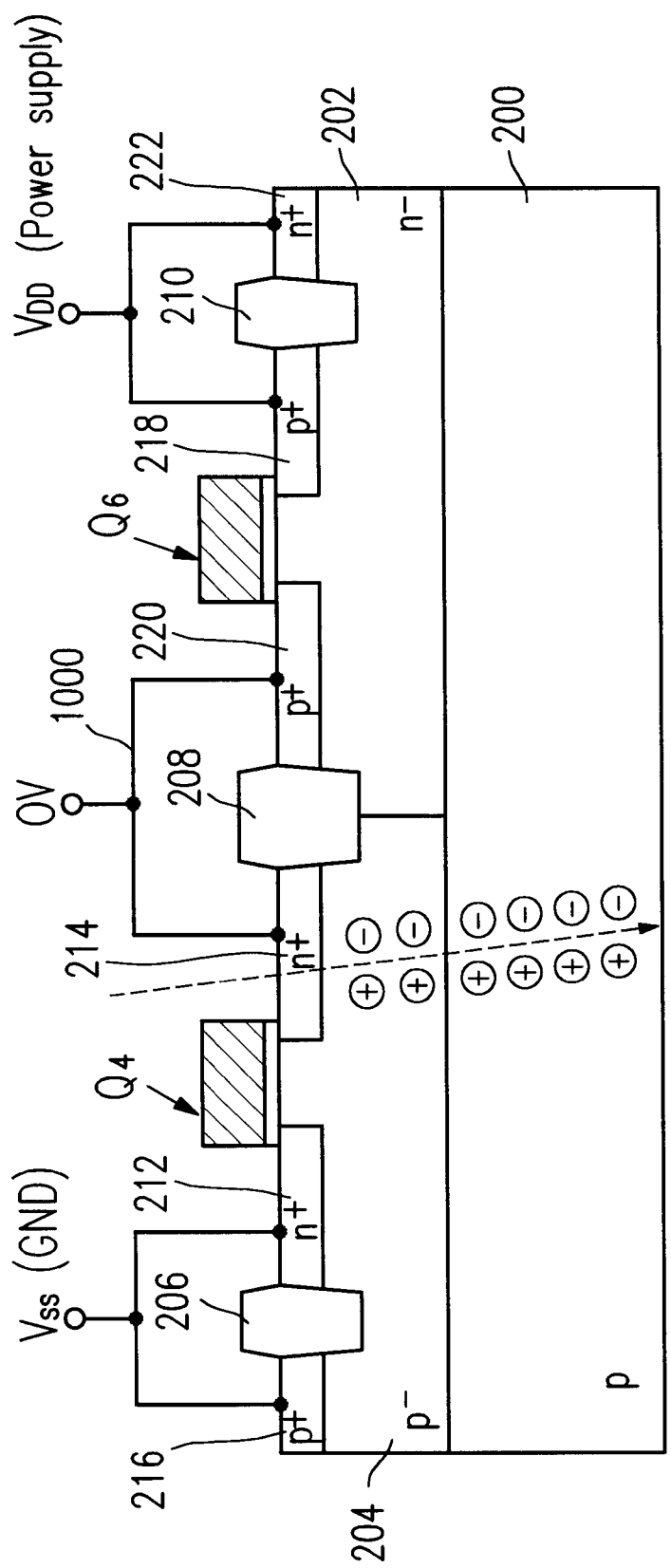
FIG. 25 is a first cross-sectional view, which is used to explain the α-ray soft error in an SRAM.

FIG. 24 is a cross-sectional view of a semiconductor memory device in accordance with a third embodiment of the present invention. In a semiconductor memory device 5 shown in FIG. 24, the same reference numerals are used for elements having the same functions as those of the elements of the semiconductor memory device 3 in accordance with the second embodiment of the present invention shown in FIG. 14. The semiconductor memory device 5 is different from the semiconductor memory device 3 in some respects. The differences will be described below, but the description of the elements having the same functions will be omitted.

The semiconductor memory device 5 does not have a second embedded layer 13. Therefore, the semiconductor memory device 5 has the following characteristic effects.

In the semiconductor memory device 5, the memory cell region 12 has only one embedded layer, that is the first embedded layer 11. Accordingly, this structure provides a higher freedom in designing a pattern (area, location, etc.) for the first embedded layer 11. For example, the area for the first embedded layer 11 shown in FIG. 24 can be extended to an area below the drain 37 of the transfer transistor 35. By this structure, the workability of the resist pattern that is used for the first embedded layer 11 shown in FIG. 17 is improved. Accordingly, the applicability of the process to a smaller memory cell can be improved.

The semiconductor memory device 5 of the third embodiment achieves substantially the same effects (i.e., Effect 1, Effect 3 and Effect 4) of the semiconductor memory device 1 of the first embodiment described above.

The semiconductor memory device 5 of the third embodiment can prevent the α-ray soft error that may be generated in the drain 28 of the load transistor 22 (that is an element composing a cell node 39), in a similar manner described above with reference to the semiconductor memory device 3 of the second embodiment.

The semiconductor memory device 5 may be manufactured by the same manufacturing method employed for manufacturing the semiconductor memory device 3, as shown in FIG. 17 through FIG. 23. While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor memory device having a semiconductor substrate defining a main surface, and a peripheral circuit region and an SRAM memory cell region in the main surface, comprising:

a first well, a second well of a first conductivity type, a third well of a second conductivity type, a device element isolation structure, an embedded layer of the second conductivity type, a driver transistor, a load transistor and an impurity region of the second conductivity type, wherein the first well is formed in the peripheral circuit region, the second well is formed in the memory cell region, the second well is shallower than the first well, the driver transistor is formed in the second well, the impurity region is formed in the second well, the impurity region is a drain of the driver transistor, the impurity region is an element that composes a cell node, the third well is formed in the memory cell region, the third well is shallower than the first well the load transistor is formed in the third well, the device element isolation structure is formed in the memory cell region, the device element isolation structure isolates the driver transistor from the load transistor, the second well and the third well are formed to extend to a location under the device element isolation structure, the embedded layer is formed under the second well and below an area where at least the impurity region is located, the embedded layer forms a junction with the second well, and the embedded layer is fixed at a potential that prevents carriers of the second conductivity type in the embedded layer from flowing into the second well.

2. A semiconductor memory device according to claim 1, further comprising another impurity region of the first conductivity type, wherein the another impurity region is formed in the third well, the another impurity region is a drain of the load transistor, the another impurity region is an element that forms the cell node, the embedded layer is not formed in an area under the third well where the another impurity region is located, and the semiconductor substrate is the first conductivity type.

3. A semiconductor memory device according to claim 1, further comprising a well contact region of the second conductivity type, wherein the well contact region is formed in the third well, the well contact region is a contact region that fixes a well potential of the third well, and the embedded layer contacts the third well.

4. A semiconductor memory device according to claim 1, further comprising another embedded layer of the first conductivity type, wherein the another embedded layer is formed under the second well, and the another embedded layer contacts the second well.

5. A semiconductor memory device according to claim 1, wherein the first well, the second well and the third well are retrograded wells.

6. A semiconductor memory device according to claim 5, wherein each of the first well, the second well and the third well has a first concentration layer, a second concentration layer and a third concentration layer in the order from a top layer, wherein the first well further has a fourth concentration layer under the third concentration layer.

7. A semiconductor memory device according to claim 1, the device element isolation region has a length ranging from 0.2 μm to 1.6 μm.

8. A semiconductor memory device according to claim 1, wherein the second well and the third well have a depth ranging from 0.5 μm to 1.2 μm.

9. A semiconductor memory device according to claim 1, wherein the semiconductor substrate is of p-type.

* * * * *